United States Patent
Watanabe

(10) Patent No.: US 9,385,682 B2
(45) Date of Patent: Jul. 5, 2016

(54) HIGH FREQUENCY COMPONENT AND FILTER COMPONENT

(71) Applicant: Murata Manufacturing Co., Ltd., Nagaokakyo-shi, Kyoto-fu (JP)

(72) Inventor: Kunihiro Watanabe, Nagaokakyo (JP)

(73) Assignee: Murata Manufacturing Co., Ltd., Kyoto (JP)

(*) Notice: Subject to any disclaimer, the term of this patent is extended or adjusted under 35 U.S.C. 154(b) by 0 days.

(21) Appl. No.: 14/309,918

(22) Filed: Jun. 20, 2014

(65) Prior Publication Data
US 2015/0028969 A1    Jan. 29, 2015

(30) Foreign Application Priority Data
Jul. 24, 2013   (JP) ................................. 2013-153346

(51) Int. Cl.
*H03H 7/01*   (2006.01)
*H03H 7/09*   (2006.01)
(Continued)

(52) U.S. Cl.
CPC ......... *H03H 7/0115* (2013.01); *H01F 17/0013* (2013.01); *H03H 7/0161* (2013.01); *H03H 7/09* (2013.01); *H03H 7/1758* (2013.01);
(Continued)

(58) Field of Classification Search
CPC ............... H03H 2001/0085; H03H 7/0115; H03H 7/09
USPC .................... 333/175, 185; 336/200
See application file for complete search history.

(56) References Cited

U.S. PATENT DOCUMENTS 5,493,261 A * 2/1996 Kitoh ................ H01P 1/205 333/206
5,926,377 A * 7/1999 Nakao ............... H05K 1/0227 174/255

(Continued)

FOREIGN PATENT DOCUMENTS

EP    2 009 787 A1    12/2008
JP    3-274814 A      12/1991
(Continued)

OTHER PUBLICATIONS

JP2005-347781 (English Translation); Oshimura Masahiko; Dec. 2005.*

(Continued)

*Primary Examiner* — Robert Pascal
*Assistant Examiner* — Rakesh Patel
(74) *Attorney, Agent, or Firm* — Keating & Bennett, LLP

(57) ABSTRACT

A high frequency component includes a multilayer body including a plurality of insulating layers stacked in a stacking direction, linear conductors extending along the insulating layers, interlayer connection conductors extending through at least one of the insulating layers, and planar conductors extending along the insulating layers. The high frequency component further includes transverse coils and internal capacitors. Each of the transverse coils includes the linear conductors and the interlayer connection conductors spirally wound in a plane in a plurality of turns around a winding axis extending in a direction perpendicular or substantially perpendicular to the stacking direction. Each of the internal capacitors includes the planar conductors being opposed to each other such that at least one of the insulating layers is disposed therebetween, the internal capacitor being arranged within a coil opening of the transverse coil when viewed along the winding axis of the transverse coil.

20 Claims, 11 Drawing Sheets

(51) Int. Cl.
*H01F 17/00* (2006.01)
*H03H 1/00* (2006.01)

(52) U.S. Cl.
CPC ........... *H03H7/1766* (2013.01); *H03H 7/1775* (2013.01); *H01F 2017/0026* (2013.01); *H03H 2001/0085* (2013.01)

(56) References Cited

U.S. PATENT DOCUMENTS

| | | | | |
|---|---|---|---|---|
| 7,671,706 | B2* | 3/2010 | Taniguchi | H03H 7/09 333/175 |
| 8,159,314 | B1 | 4/2012 | Estes | |
| 2002/0052179 | A1* | 5/2002 | Hwang | H03H 7/1775 455/11.1 |
| 2006/0145805 | A1 | 7/2006 | Kim et al. | |
| 2011/0248811 | A1* | 10/2011 | Kireev | H01L 23/5227 336/200 |
| 2013/0154782 | A1* | 6/2013 | Won | H01F 5/02 336/192 |
| 2013/0341078 | A1* | 12/2013 | Hardin | H05K 1/0222 174/267 |
| 2014/0145798 | A1* | 5/2014 | Masuda | H03H 7/09 333/185 |
| 2014/0292443 | A1 | 10/2014 | Nosaka | |

FOREIGN PATENT DOCUMENTS

| | | |
|---|---|---|
| JP | 4-142712 A | 5/1992 |
| JP | 10-065476 A | 3/1998 |
| JP | 2001-358020 A | 12/2001 |
| JP | 2003-258587 A | 9/2003 |
| JP | 2005-347286 A | 12/2005 |
| JP | 2005-347781 A | 12/2005 |
| JP | 2005-347782 A | 12/2005 |
| JP | 2006-54207 A | 2/2006 |
| JP | 2006-311203 A | 11/2006 |
| JP | 3920294 B2 | 5/2007 |
| JP | 2009-153106 A | 7/2009 |
| WO | 2007-119356 A1 | 10/2007 |
| WO | 2009/090917 A1 | 7/2009 |
| WO | 2013/069419 A1 | 5/2013 |

OTHER PUBLICATIONS

Official Communication issued in corresponding European Patent Application No. 14 171 052.5, mailed on Jan. 13, 2015.
Official Communication issued in corresponding European Patent Application No. 14171052.5, mailed on Dec. 23, 2014.
Official Communication issued in corresponding Japanese Patent Application No. 2013-153346, mailed on May 12, 2015.
Official Communication issued in corresponding Japanese Patent Application No. 2013-153346, mailed on Oct. 27, 2015.

* cited by examiner

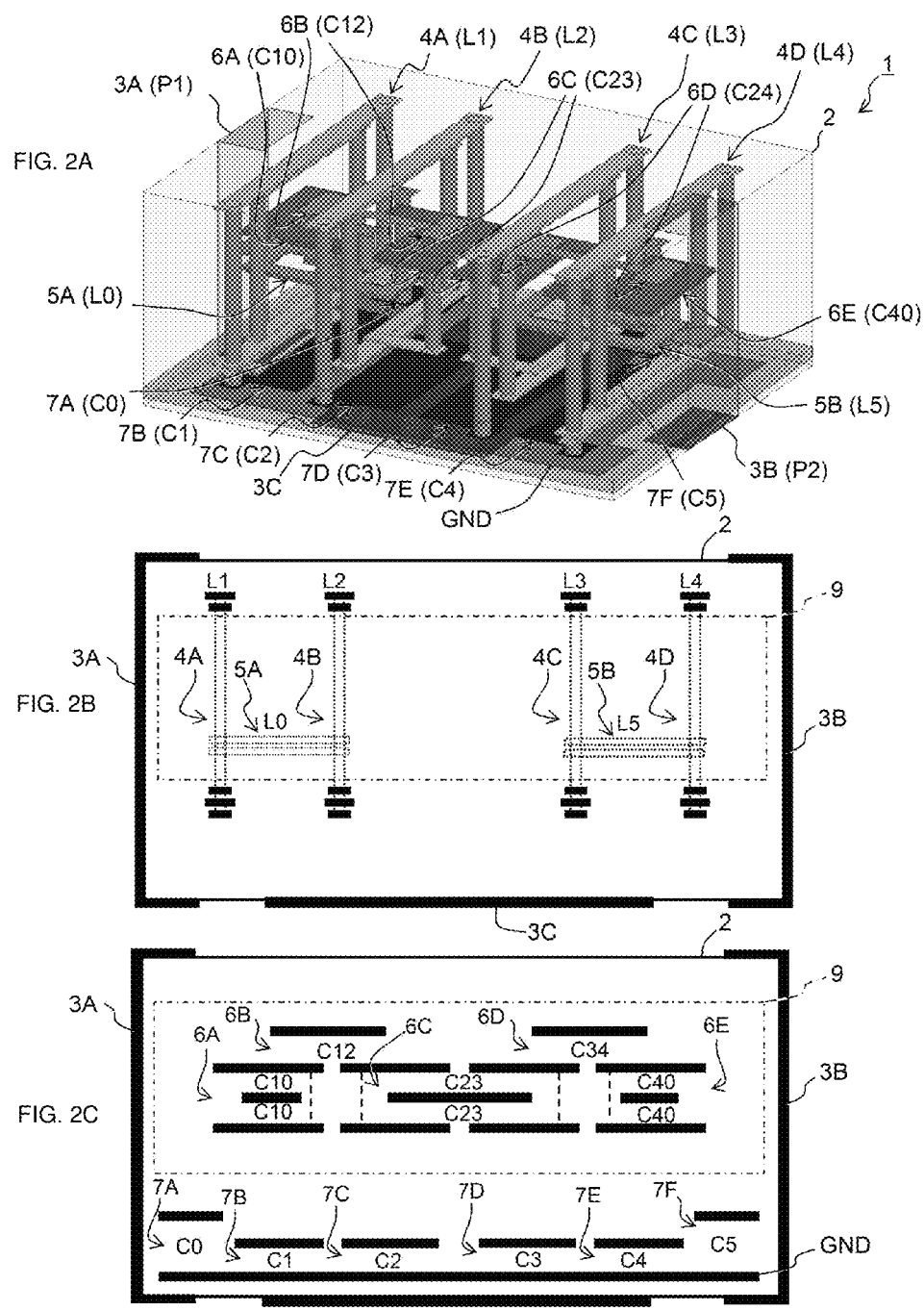

HIGH FREQUENCY COMPONENT AND FILTER COMPONENT

BACKGROUND OF THE INVENTION

1. Field of the Invention

The present invention relates to a high frequency component including an LC circuit disposed in a multilayer body.

2. Description of the Related Art

A component including an LC circuit disposed in a multilayer body is used as a high frequency component. Such a high frequency component including an LC circuit needs to support various frequencies and have a filter characteristic with a steep attenuation pole, and it is necessary to appropriately set the number of stages of resonant circuits that define the LC circuit and the circuit constant of the LC circuit.

When an inductor included in the LC circuit is made of a coil-shaped conductive pattern, the inductance can be increased by increasing the size of the opening of the coil or by increasing in the number of turns of the coil. However, the increase in the size of the opening of the coil or in the number of turns of the coil may lead to an increased size of the multilayer body. To address that issue, a conductive pattern with a plurality of turns spirally wound in a plane may be used to increase the number of turns of the coil without increasing the size of the multilayer body (see, for example, Japanese Unexamined Patent Application Publication No. 10-65476 and Japanese Patent No. 3920294).

Japanese Unexamined Patent Application Publication No. 10-65476 describes a coil including a conductive pattern that includes a plurality of turns spirally wound around a winding axis extending in a stacking direction of insulating layers included in a multilayer body in a plane substantially parallel to each of the layers of the multilayer body. Japanese Patent No. 3920294 describes a coil including a conductive pattern that includes a plurality of turns spirally wound around a winding axis extending in a direction substantially perpendicular to a stacking direction of insulating layers included in a multilayer body in a plane substantially perpendicular to each of the layers of the multilayer body.

Hereinafter, a coil wound around a winding axis extending in a direction substantially perpendicular to a stacking direction of layers in a multilayer body is referred to as a transverse coil, and a coil wound around a winding axis extending in a stacking direction of layers in a multilayer body is referred to as a longitudinal coil.

The use of the above-described transverse coil or longitudinal coil in a multilayer body can achieve a relatively large inductance. However, even with the use of the transverse coil or longitudinal coil as an inductor included in an LC circuit, size reduction in the multilayer body may be difficult, depending on the configuration of a capacitor included in the LC circuit.

SUMMARY OF THE INVENTION

Accordingly, preferred embodiments of the present invention provide a high frequency component including an LC circuit suited for miniaturization of a multilayer body.

According to a preferred embodiment of the present invention, a high frequency component includes a multilayer body, linear conductors, interlayer connection conductors, planar conductors, a transverse coil, and an internal capacitor. The multilayer body includes a plurality of insulating layers stacked in a stacking direction. The linear conductors extend along surfaces of the insulating layers. The interlayer connection conductors extend through at least one of the insulating layers. The planar conductors expand along the surfaces of the insulating layers. The transverse coil includes the linear conductors and the interlayer connection conductors spirally wound in a plurality of turns around a winding axis extending in a direction perpendicular or substantially perpendicular to the stacking direction in a plane perpendicular or substantially perpendicular to the winding axis. The internal capacitor includes the planar conductors being arranged opposite to each other such that at least one of the insulating layers is disposed therebetween. The internal capacitor is arranged within a coil opening of the transverse coil when viewed along the winding axis of the transverse coil.

With this configuration, the transverse coil includes the interlayer connection conductors whose resistances are lower than those of the linear conductors. When an LC resonant circuit includes the transverse coil, the LC resonant circuit has an improved Q value, in comparison with when the LC resonant circuit includes a longitudinal coil. The arrangement of the internal capacitor within the coil opening of the transverse coil enables the number of insulating layers required for the internal capacitor and the area thereof to be reduced, and the multilayer body is miniaturized. In addition, the connection wiring required to connect the transverse coil and the internal capacitor is shortened, a parasitic inductance and a parasitic capacitance occurring in the connection wiring is reduced, and the original characteristics of the transverse coil can be used in the LC resonant circuit. Because the plane around which the transverse coil is wound and the planar conductors in the internal capacitor are perpendicular or substantially perpendicular to each other, the original characteristics of the transverse coil are not significantly changed by the effect of the internal capacitor, and satisfactory high frequency characteristics are easily achieved.

The above-described high frequency component preferably further includes an external capacitor including the planar conductors being arranged opposite to each other such that at least one of the insulating layers is disposed therebetween, the external capacitor being arranged outside the coil opening of the transverse coil when viewed along the winding axis of the transverse coil. The external capacitor and the transverse coil may preferably define an LC resonant circuit. Thus, for example, when a capacitor having a larger electrode area of the internal capacitor and the external capacitor is arranged as the external capacitor in a location outside the transverse coil, a parasitic capacitance occurring between the transverse coil and the internal capacitor is reduced, and the inductance value of the transverse coil is prevented from being significantly changed by the parasitic capacitance.

The at least one insulating layer between the planar conductors in at least one of the internal capacitor and the external capacitor may preferably have a relative permittivity higher than that of another insulating layer. Thus, the capacitance of the at least one of the internal capacitor and the external capacitor achieves an increased capacitance, and the electrode area is reduced. When the insulating layer in the internal capacitor has a higher relative permittivity, the electrode area in the internal capacitor is reduced, and a parasitic capacitance occurring between the internal capacitor and the transverse coil is significantly reduced or prevented. When the insulating layer in the external capacitor has a higher relative permittivity, the characteristics of the transverse coil are prevented from being significantly changed by the effect of the insulating layer.

The above-described high frequency component preferably further includes a longitudinal coil including the linear conductors wound around a winding axis extending in the stacking direction. The longitudinal coil is preferably arranged within the coil opening of the transverse coil when viewed along the winding axis of the transverse coil. Thus, the number of insulating layers required for the longitudinal coil within the coil opening of the transverse coil and the area thereof is reduced, and the multilayer body is miniaturized. Even with such an arrangement of the transverse coil and the longitudinal coil, the plane around which the transverse coil is wound and the plane around which the longitudinal coil is wound are perpendicular or substantially perpendicular to each other, and thus, the original characteristics of both of the coils are prevented from being significantly changed. This also contributes to being able to easily achieve satisfactory high frequency characteristics.

Of the plurality of linear conductors included in the transverse coil, two linear conductors including different turns and being adjacent in the stacking direction may preferably have different line widths. Thus, even if there is misregistration or misalignment of the linear conductors included in the transverse coil at the time of manufacturing, an opposed area of the linear conductors and an area opposed to the internal capacitor are ensured.

When one of both ends of a transverse coil is the starting point of the transverse coil and the other end is the ending point of the transverse coil, a first turn of the transverse coil is a portion including two interlayer connection conductors and two linear conductors wound continuously from the starting point of the transverse coil. A second turn of the transverse coil is a portion including two interlayer connection conductors and two linear conductors wound continuously from the first turn of the transverse coil or a portion including at most two interlayer connection conductors and two linear conductors wound to the ending point of the transverse coil. The same applies to third and subsequent turns of the transverse coil. That is, the first turn of the transverse coil is the portion including two interlayer connection conductors and two linear conductors wound continuously from the starting point of the transverse coil or from the previous turn or the portion including at most two interlayer connection conductors and two linear conductors wound to the ending point of the transverse coil.

Of the plurality of linear conductors included in the transverse coil, two linear conductors including a same number of turns and being adjacent in the stacking direction may preferably be connected in parallel with each other through the interlayer connection conductors. Thus, the linear conductors included in the transverse coil can have a multilayer structure, the effective cross-sectional area of the linear conductors is increased, and the transverse coil has a reduced resistance. Accordingly, the LC resonant circuit has an increased Q value.

According to another preferred embodiment of the present invention, a filter component includes the above-described high frequency component and a filter circuit included in the high frequency component. The filter circuit may preferably include a plurality of LC resonant circuits each including the transverse coil. The transverse coils included in the LC resonant circuits may preferably be configured such that their winding axes are parallel or substantially parallel to each other and their coil openings overlap each other when viewed along the winding axes. Thus, because the multistage LC resonant circuits are electromagnetically coupled together through the transverse coils, the coupling between the LC resonant circuits (inter-resonator coupling) are adjustable by adjusting the shape of each of the transverse coils and the arrangement thereof. Accordingly, an attenuation pole and other elements in the filter characteristic of the filter component are effectively controlled.

The internal capacitor may preferably function as a capacitor for inter-resonator coupling between the plurality of LC resonant circuits. Thus, the wiring path connecting the multistage LC resonant circuits is shortened while the multistage LC resonant circuits are capacitive-coupled through the internal capacitors functioning as the capacitors for inter-resonator coupling. Accordingly, the insertion loss of the high frequency component is reduced, and a satisfactory filter characteristic is achieved.

The plurality of LC resonant circuits may preferably include an input-stage LC resonant circuit, an output-stage LC resonant circuit, and an intermediate-stage LC resonant circuit coupled between the input-stage LC resonant circuit and the output-stage LC resonant circuit. Each of the linear conductors included in the transverse coil included in the intermediate-stage LC resonant circuit may preferably have a width larger than that of each of the linear conductors included in each of the input-stage LC resonant circuit and the output-stage LC resonant circuit. With this configuration, the Q value of the intermediate-stage LC resonant circuit is improved, and the insertion loss of the high frequency component is significantly reduced.

In the high frequency component according to various preferred embodiments of the present invention, because the internal capacitor is arranged within the coil opening of the transverse coil when viewed along the winding axis of the transverse coil, the number of insulating layers required for the internal capacitor and the area thereof is reduced, and the size of the multilayer body is reduced. In addition, the connection wiring required to connect the transverse coil and the internal capacitor is shortened, and the conductive patterns of the transverse coil and the planar conductors of the internal capacitor are perpendicular or substantially perpendicular to each other. Accordingly, satisfactory high frequency characteristics is easily achieved.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 2A is a transparent perspective view of the high frequency component according to the first preferred embodiment of the present invention, and FIGS. 2B and 2C are schematic cross-sectional views thereof.

DETAILED DESCRIPTION OF THE PREFERRED EMBODIMENTS

A high frequency component according to a first preferred embodiment of the present invention is described below. The high frequency component illustrated herein preferably functions as a high pass filter, which has a cutoff frequency band lower than a pass band.

Figure 1:
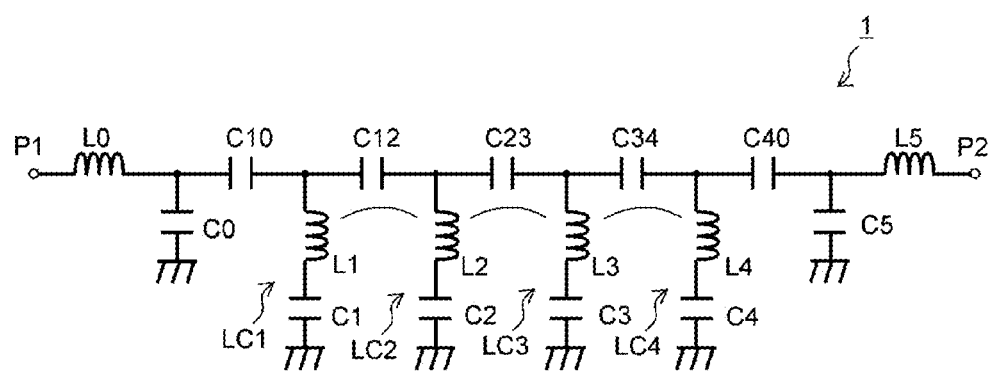
FIG. 1 is an equivalent circuit diagram of a high frequency component according to a first preferred embodiment of the present invention.

FIG. 1 is an equivalent circuit diagram of a high frequency component 1 according to the first preferred embodiment. The high frequency component 1 preferably functions as a high pass filter including input and output ports P1 and P2, capacitors C0, C1, C2, C3, C4, C5, C10, C12, C23, C34, and C40, and inductors L0, L1, L2, L3, L4, and L5.

In the high frequency component 1, the inductor L1 and the capacitor C1 define a serial resonant circuit LC1. Similarly, the inductor L2 and the capacitor C2 define a serial resonant circuit LC2. The inductor L3 and the capacitor C3 define a serial resonant circuit LC3. The inductor L4 and the capacitor C4 define a serial resonant circuit LC4. The capacitor C12 is connected between the resonant circuits LC1 and LC2. Similarly, the capacitor C23 is connected between the resonant circuits LC2 and LC3. The capacitor C34 is connected between the resonant circuits LC3 and LC4. The above-described circuitry portion defines a circuit of the high pass filter in which the four-stage resonant circuits are coupled together through the capacitors.

Among the four-stage resonant circuits LC1 to LC4 defining the high pass filter, the serial resonant circuit LC1 is an input-stage resonant circuit and is coupled to the input port P1 through the capacitor C10 for external coupling. The serial resonant circuit LC2 is an intermediate-stage (second-stage) resonant circuit and is coupled to the input-stage serial resonant circuit LC1 through the capacitor C12. The serial resonant circuit LC3 is an intermediate-stage (third-stage) resonant circuit and is coupled to the second-stage serial resonant circuit LC2 through the capacitor C23. The serial resonant circuit LC4 is an output-stage resonant circuit, is coupled to the third-stage serial resonant circuit LC3 through the capacitor C34, and is coupled to the output port P2 through the capacitor C40 for external coupling.

An impedance matching circuit including the inductor L0 connected in series and the capacitor C0 connected in shunt is connected between the input port P1 and the capacitor C10. Similarly, an impedance matching circuit including the inductor L5 connected in series and the capacitor C5 connected in shunt is connected between the output port P2 and the capacitor C40.

The inductors (resonance inductors) of neighboring resonant circuits among the resonant circuits LC1 to LC4 are electromagnetically coupled to each other. That is, the inductors L1 and L2 are electromagnetically coupled to each other. Similarly, the inductors L2 and L3 are electromagnetically coupled to each other. The inductors L3 and L4 are electromagnetically coupled to each other. Accordingly, the resonant circuits LC1 to LC4 are coupled by both the capacitive coupling of the capacitors (coupling capacitors) C12, C23, and C34 and the electromagnetic coupling of the inductors (resonance inductors) L1, L2, L3, and L4.

FIG. 2A is a transparent perspective view of the high frequency component 1 according to the first preferred embodiment.

The high frequency component 1 includes a multilayer body 2 preferably having a rectangular or substantially rectangular parallelepiped shape, for example. In the following description, the surface on the near left side of the multilayer body 2 illustrated in FIG. 2A is referred to as the front surface, the surface on the far right side of the multilayer body 2 is referred to as the back surface, the surface on the near right side of the multilayer body 2 is referred to as the right side surface, the surface on the far left side of the multilayer body 2 is referred to as the left side surface, the surface on the upper side of the multilayer body 2 is referred to as the top surface, and the surface on the lower side of the multilayer body 2 is referred to as the bottom surface.

The multilayer body 2 includes a plurality of insulating layers stacked in a stacking direction perpendicular or substantially perpendicular to the bottom surface and the top surface. The insulating layers in the multilayer body 2 may preferably be made of, for example, a resin material, such as thermoplastic resin, or a ceramic material, such as low temperature co-fired ceramic. A linear conductor extending in a direction perpendicular or substantially perpendicular to the stacking direction is disposed between the insulating layers in the multilayer body 2. A planar conductor extending in a direction perpendicular or substantially perpendicular to the stacking direction is disposed between the insulating layers in the multilayer body 2. The linear conductor may preferably be made of, for example, a fired body of conductive paste formed by printing or copper foil patterned by a photolithographic process. An interlayer connection conductor extends in the stacking direction through at least one of the insulating layers in the multilayer body 2. The interlayer connection conductor may preferably be formed by metalizing conductive paste filled in a via hole in each of the insulating layers, for example.

Input and output electrodes 3A and 3B and a ground electrode 3C are disposed on the outer surface of the multilayer body 2. Transverse coils 4A, 4B, 4C, and 4D, longitudinal coils 5A and 5B, internal capacitors 6A, 6B, 6C, 6D, and 6E, and external capacitors 7A, 7B, 7C, 7D, 7E, and 7F are disposed inside the multilayer body 2.

The input and output electrode 3A extends from the top surface to the bottom surface through the left side surface of the multilayer body 2. The input and output electrode 3B extends from the top surface to the bottom surface through the right side surface of the multilayer body 2. The ground electrode 3C is disposed on the bottom surface of the multilayer body 2.

The transverse coils 4A, 4B, 4C, and 4D are arranged in sequence from the left side surface toward the right side surface inside the multilayer body 2. Each of the transverse coils 4A, 4B, 4C, and 4D includes at least three interlayer connection conductors and at least three linear conductors that are connected together. Each of the transverse coils 4A, 4B, 4C, and 4D includes a plurality of turns spirally wound around a winding axis extending in a direction perpendicular or substantially perpendicular to the stacking direction of the insulating layers in the multilayer body 2, that is, around a winding axis extending in a direction connecting the left side surface and the right side surface of the multilayer body 2 in a single plane that is perpendicular or substantially perpendicular to the top surface and the bottom surface of the multilayer body 2 and that is parallel or substantially parallel to the left side surface and the right side surface. Each of the transverse coils 4A, 4B, 4C, and 4D includes the interlayer connection conductors having lower resistances than those of the linear conductors. The inclusion of these transverse coils 4A, 4B, 4C, and 4D in the resonant circuits LC1 to LC4 enables the resonant circuits LC1 to LC4 to have high Q values.

The longitudinal coils 5A and 5B are arranged in sequence from the left side surface toward the right side surface inside the multilayer body 2. Each of the longitudinal coils 5A and 5B is a helical coil in which a plurality of linear conductors wound in a loop in a plane parallel or substantially parallel to the top surface and the bottom surface of the multilayer body 2 around a winding axis extending in the stacking direction of the insulating layers and connecting the top surface and the bottom surface of the multilayer body 2 are connected together in the stacking direction of the insulating layers. Specific preferred configurations of the interlayer connection conductors and the linear conductors in the transverse coils 4A, 4B, 4C, and 4D and the longitudinal coils 5A and 5B will be described below.

The internal capacitors 6A, 6B, 6C, 6D, and 6E are arranged in sequence from the left side surface toward the right side surface inside the multilayer body 2. Each of the internal capacitors 6A, 6B, 6C, 6D, and 6E includes planar conductors parallel or substantially parallel to the top surface and the bottom surface of the multilayer body 2 that are opposed to each other, such that at least one of the insulating layers is disposed therebetween.

The external capacitors 7A, 7B, 7C, 7D, 7E, and 7F are arranged in sequence from the left side surface toward the right side surface inside the multilayer body 2. Each of the external capacitors 7A, 7B, 7C, 7D, 7E, and 7F includes planar conductors parallel or substantially parallel to the top surface and the bottom surface of the multilayer body 2 that are opposed to each other such that at least one of the insulating layers is disposed therebetween. One of the planar conductors in each of the external capacitors 7A, 7B, 7C, 7D, 7E, and 7F is a ground electrode GND, which is a common electrode. Specific preferred configurations of the planar conductors in the internal capacitors 6A, 6B, 6C, 6D and 6E and the external capacitors 7A, 7B, 7C, 7D, 7E, and 7F will be described below.

Correspondences between the configurations in the multilayer body 2 and the circuit elements in the circuitry illustrated in FIG. 1 are described below. The input and output electrode 3A corresponds to the input port P1 in FIG. 1. The input and output electrode 3B corresponds to the output port P2 in FIG. 1. The transverse coils 4A, 4B, 4C, and 4D correspond to the inductors L1, L2, L3, and L4 in FIG. 1, respectively. The longitudinal coils 5A and 5B correspond to the inductors L0 and L5 in the impedance matching circuits in FIG. 1, respectively. The internal capacitors 6B, 6C, and 6D correspond to the capacitors C12, C23, and C34 for inter-resonator coupling in FIG. 1, respectively. The external capacitors 7B, 7C, 7D, and 7E correspond to the capacitors C1, C2, C3, and C4 for resonance in FIG. 1, respectively. The internal capacitors 6A and 6E correspond to the capacitors C10 and C40 for external coupling in FIG. 1, respectively. The external capacitors 7A and 7F correspond to the capacitors C0 and C5 in the impedance matching circuits in FIG. 1, respectively.

FIG. 2B is a schematic cross-sectional view that illustrates the arrangement of the transverse coils 4A to 4D and the longitudinal coils 5A and 5B in the multilayer body 2. FIG. 2C is a schematic cross-sectional view that illustrates the arrangement of the internal capacitors 6A to 6E and the external capacitors 7A to 7F in the multilayer body 2. Each of FIGS. 2B and 2C is a cross-sectional view of the multilayer body 2 taken along a plane parallel or substantially parallel to the front surface and the back surface of the multilayer body 2.

The coil openings of the neighboring transverse coils of the transverse coils 4A to 4D are opposed to each other. When the multilayer body 2 is viewed along the winding axis of each of the transverse coils 4A to 4D from the left side surface or the right side surface in a transparent manner, the coil openings of the transverse coils 4A to 4D overlap each other and coincide with each other. Accordingly, the transverse coils 4A to 4D are electromagnetically coupled to each other. A region in the multilayer body 2 where the coil openings of the transverse coils 4A to 4D overlap each other when the multilayer body 2 is viewed from the left side surface or the right side surface of the multilayer body 2 in a transparent manner is indicated as an internal region 9 in FIGS. 2B and 2C.

In the above-described configuration, the longitudinal coils 5A and 5B and the internal capacitors 6A to 6E are arranged in the internal region 9, that is, in the coil openings of the transverse coils 4A to 4D. Thus, it is not necessary to provide additional space to accommodate the longitudinal coils 5A and 5B and the internal capacitors 6A to 6E in a region outside the coil openings of the transverse coils 4A to 4D in the multilayer body 2, such that the base area of the multilayer body 2 and the number of the insulating layers are reduced, and the multilayer body 2 is miniaturized. Alternatively, an increase in the number of turns of each of the transverse coils 4A to 4D or an increase in the size of each of the coil openings enables an increase in the inductance of each of the transverse coils 4A to 4D. The increase in the inductance of each of the transverse coils 4A to 4D achieves a high pass filter with a low cutoff frequency.

With the above-described configuration, the connection wiring required to connect the transverse coils 4A, 4B, 4C, and 4D, the longitudinal coils 5A and 5B, and the internal capacitors 6A to 6E is shortened. This reduces degradation in the filter characteristic caused by a parasitic inductance or a parasitic capacitance occurring in the connection wiring. In particular, an arrangement in which the capacitors C12, C23, and C34 for inter-resonator coupling, the capacitors C10 and C40 for external coupling, and the inductors L0 and L5 for impedance matching in the input and output portions are disposed within the coil openings of the transverse coils 4A, 4B, 4C, and 4D (internal region 9) shorten the connection wiring between the input and output ports P1 and P2 and greatly reduce the insertion loss of the high frequency component 1 (high pass filter).

Moreover, the linear conductors in the longitudinal coils 5A and 5B and the planar conductors in the internal capacitors 6A to 6E are perpendicular or substantially perpendicular to the plane around which each of the transverse coils 4A to 4D is wound. A magnetic flux occurring within the coil opening of each of the transverse coils 4A to 4D in the internal region 9 extends along the winding axis of each of the transverse coils 4A to 4D, that is, a direction connecting the left side surface and the right side surface of the multilayer body 2. The linear conductors in the longitudinal coils 5A and 5B and the planar conductors in the internal capacitors 6A to 6E are parallel or substantially parallel to the magnetic flux occurring within the coil opening of each of the transverse coils 4A to 4D, does not substantially block the magnetic flux occurring within the coil opening of each of the transverse coils 4A to 4D, and thus, have little effect on the characteristics of the transverse coils 4A to 4D. The plane around which each of the longitudinal coils 5A and 5B is wound is perpendicular or substantially perpendicular to the plane around which each of the transverse coils 4A to 4D is wound. Thus, a magnetic flux occurring within the coil opening of each of the longitudinal coils 5A and 5B extends along a direction connecting the top surface and the bottom surface of the multilayer body 2 (stacking direction), and the longitudinal coils 5A and 5B and the transverse coils 4A to 4D are not easily electromagnetically coupled to each other. Accordingly, the filter characteristic of the high frequency component 1 is easily set.

Here, the external capacitors 7B to 7E preferably define the capacitors C1 to C4 for resonance. Alternatively, internal capacitors may define the capacitors C1 to C4 for resonance. When the capacitance of each of the capacitors C1 to C4 for resonance is large, a large electrode area is required. Thus, if the internal capacitors define the capacitors C1 to C4 for resonance, unnecessary coupling occurring between the capacitors C1 to C4 for resonance and the transverse coils 4A to 4D is relatively large, which degrades the filter characteristic. To address this issue, in the present preferred embodiment, the external capacitors 7B to 7E define the capacitors C1 to C4 for resonance that require a large electrode area in order to prevent degradation in the filter characteristic.

The insulating layer located between the planar conductors in each of the external capacitors 7A to 7F (the insulating layer, indicated with a different density, in the vicinity of the bottom surface in FIG. 2A) preferably has a relative permittivity higher than that of another insulating layer. That is, a relative permittivity between the two planar conductors in each of the external capacitors 7A to 7F is high. Thus, the capacitance of each of the external capacitors 7A to 7F is further increased.

The insulating layer located between the planar conductors in each of the internal capacitors 6A to 6E may preferably have a relative permittivity higher than that of another insulating layer. In this case, because the electrode area of each of the internal capacitors 6A to 6E is reduced, unnecessary coupling between the internal capacitors 6A to 6E and the transverse coils 4A to 4D is further reduced, and thus, the characteristics of the transverse coils 4A to 4D and the filter characteristic dependent on the resonant circuits LC1 to LC4 are further improved.

Figure 3A:
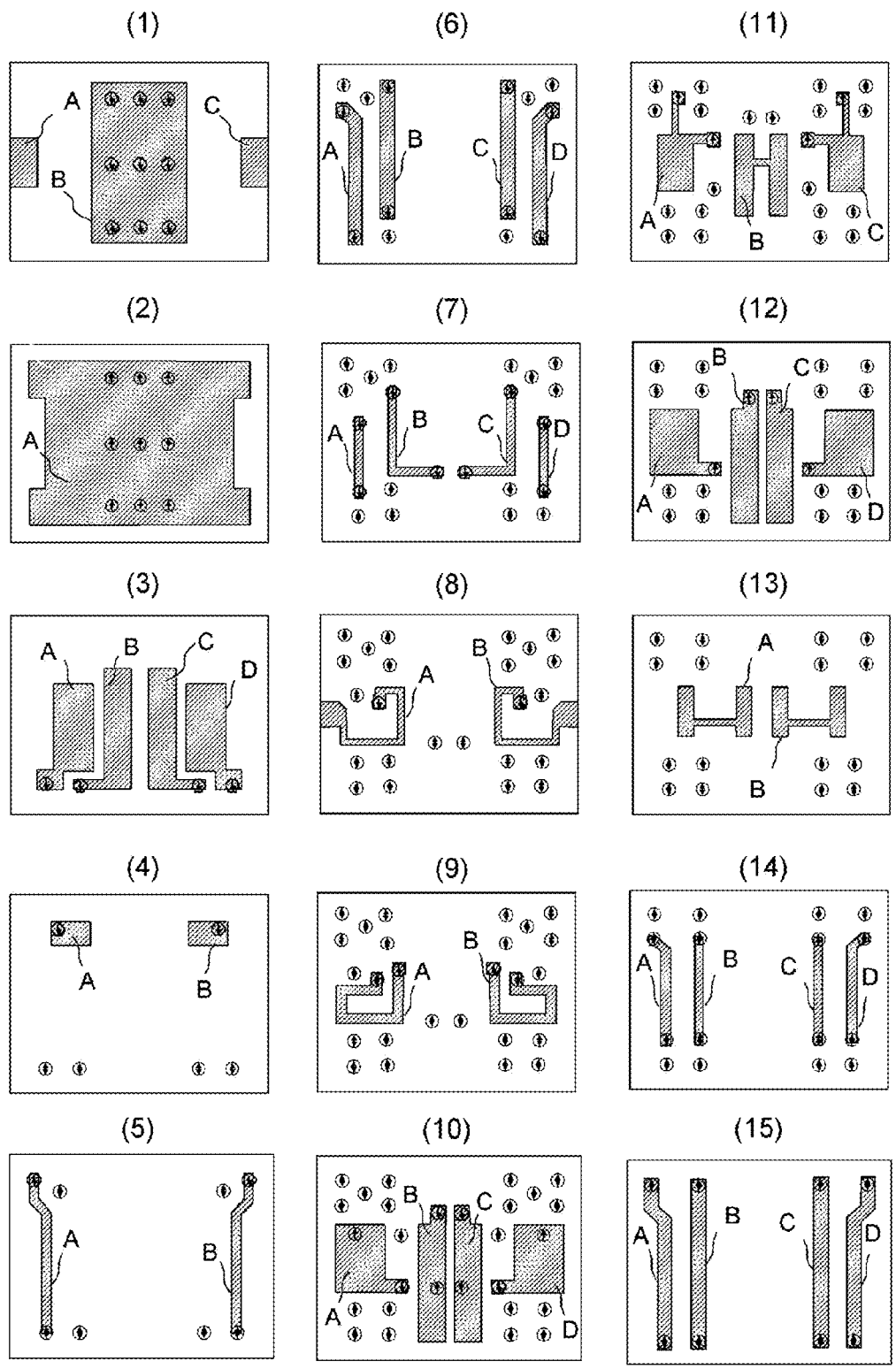
FIG. 3A includes exploded plan views of the high frequency component according to the first preferred embodiment of the present invention.

FIG. 3A includes exploded plan views of the multilayer body 2 and illustrates conductive patterns (linear conductors and planar conductors) on the insulating layers in the multilayer body 2. In FIG. 3A, the conductive patterns on the first to fifteenth layers are illustrated in sequence from the bottom surface toward the top surface of the multilayer body 2.

Letters A, B, C, and D referred to the conductive pattern on the Nth layer in FIG. 3A are read as letters N-A, N-B, N-C, and N-D in the following description. A circle with an arrow on each layer indicates a connection location and a connection direction of an interlayer connection conductor. Specifically, an upward-pointing arrow indicates connection with a conductive pattern on an immediately preceding layer (near the bottom surface), a downward-pointing arrow indicates connection with a conductive pattern on an immediately following layer (near the top surface), and a vertical double-headed arrow indicates connection with conductive patterns in both upper and lower layers (near the bottom surface and near the top surface).

The conductive pattern on the first layer is exposed to the bottom surface of the multilayer body 2 and includes planar conductors 1-A, 1-B, and 1-C. The planar conductor 1-A defines a portion of the input and output electrode 3A illustrated in FIGS. 2A to 2C. The planar conductor 1-B defines the ground electrode 3C illustrated in FIGS. 2A to 2C. The planar conductor 1-C defines a portion of the input and output electrode 3B illustrated in FIGS. 2A to 2C.

The conductive pattern on the second layer is disposed inside the multilayer body 2 and includes a planar conductor 2-A. The planar conductor 2-A is connected to the planar conductor 1-B (ground electrode 3C) through the interlayer connection conductors and defines the ground electrode GND illustrated in FIGS. 2A to 2C.

The conductive pattern on the third layer is disposed inside the multilayer body 2 and includes planar conductors 3-A, 3-B, 3-C, and 3-D. The planar conductor 3-A is opposed to the planar conductor 2-A, and they define the external capacitor 7B illustrated in FIGS. 2A to 2C. The planar conductor 3-B is opposed to the planar conductor 2-A, and they define the external capacitor 7C illustrated in FIGS. 2A to 2C. The planar conductor 3-C is opposed to the planar conductor 2-A, and they define the external capacitor 7D illustrated in FIGS. 2A to 2C. The planar conductor 3-D is opposite the planar conductor 2-A, and they constitute the external capacitor 7E illustrated in FIGS. 2A to 2C.

The conductive pattern on the fourth layer is disposed inside the multilayer body 2 and includes planar conductors 4-A and 4-B. The planar conductor 4-A is opposed to the planar conductor 2-A, and they define the external capacitor 7A illustrated in FIGS. 2A to 2C. The planar conductor 4-B is opposed to the planar conductor 2-A, and they define the external capacitor 7F illustrated in FIGS. 2A to 2C.

The conductive pattern on the fifth layer is disposed inside the multilayer body 2 and includes linear conductors 5-A and 5-B. The linear conductor 5-A defines a portion of the transverse coil 4A illustrated in FIGS. 2A to 2C. The linear conductor 5-B defines a portion of the transverse coil 4D illustrated in FIGS. 2A to 2C.

The conductive pattern on the sixth layer is disposed inside the multilayer body 2 and includes linear conductors 6-A, 6-B, 6-C, and 6-D. The linear conductor 6-A defines a portion of the transverse coil 4A illustrated in FIGS. 2A to 2C. The linear conductor 6-B defines a portion of the transverse coil 4B illustrated in FIGS. 2A to 2C. The linear conductor 6-C defines a portion of the transverse coil 4C illustrated in FIGS. 2A to 2C. The linear conductor 6-D defines a portion of the transverse coil 4D illustrated in FIGS. 2A to 2C.

The conductive pattern on the seventh layer is disposed inside the multilayer body 2 and includes linear conductors 7-A, 7-B, 7-C, and 7-D. The linear conductor 7-A defines a portion of the transverse coil 4A illustrated in FIGS. 2A to 2C. The linear conductor 7-B defines a portion of the transverse coil 4B illustrated in FIGS. 2A to 2C. The linear conductor 7-C defines a portion of the transverse coil 4C illustrated in FIGS. 2A to 2C. The linear conductor 7-D defines a portion of the transverse coil 4D illustrated in FIGS. 2A to 2C.

The conductive pattern on the eighth layer is disposed inside the multilayer body 2 and includes linear conductors 8-A and 8-B. The linear conductor 8-A is connected to the input and output electrode 3A on a side surface and defines a portion of the longitudinal coil 5A illustrated in FIGS. 2A to 2C. The linear conductor 8-B is connected to the input and output electrode 3B on another side surface and defines a portion of the longitudinal coil 5B illustrated in FIGS. 2A to 2C.

The conductive pattern on the ninth layer is disposed inside the multilayer body 2 and includes linear conductors 9-A and 9-B. The linear conductor 9-A defines a portion of the longitudinal coil 5A illustrated in FIGS. 2A to 2C. The linear conductor 9-B defines a portion of the longitudinal coil 5B illustrated in FIGS. 2A to 2C.

The conductive pattern on the 10th layer is disposed inside the multilayer body 2 and includes planar conductors 10-A, 10-B, 10-C, and 10-D. The planar conductor 10-A defines a portion of the internal capacitor 6A illustrated in FIGS. 2A to 2C. The planar conductor 10-B defines a portion of the internal capacitor 6C illustrated in FIGS. 2A to 2C. The planar conductor 10-C defines a portion of the internal capacitor 6C illustrated in FIGS. 2A to 2C. The planar conductor 10-D defines a portion of the internal capacitor 6E illustrated in FIGS. 2A to 2C.

The conductive pattern on the 11th layer is disposed inside the multilayer body 2 and includes planar conductors 11-A, 11-B, and 11-C. The planar conductor 11-A defines a portion of the internal capacitor 6A illustrated in FIGS. 2A to 2C. The planar conductor 11-B defines a portion of the internal capacitor 6C illustrated in FIGS. 2A to 2C. The planar conductor 11-C defines a portion of the internal capacitor 6E illustrated in FIGS. 2A to 2C.

The conductive pattern on the 12th layer is disposed inside the multilayer body 2 and includes planar conductors 12-A, 12-B, 12-C, and 12-D. The planar conductor 12-A defines a portion of the internal capacitor 6A and a portion of the internal capacitor 6B illustrated in FIGS. 2A to 2C. The planar conductor 12-B defines a portion of the internal capacitor 6C and a portion of the internal capacitor 6B illustrated in FIGS. 2A to 2C. The planar conductor 12-C defines a portion of the internal capacitor 6C and a portion of the internal capacitor 6D illustrated in FIGS. 2A to 2C. The planar conductor 12-D defines a portion of the internal capacitor 6E and a portion of the internal capacitor 6D illustrated in FIGS. 2A to 2C.

The conductive pattern on the 13th layer is disposed inside the multilayer body 2 and includes planar conductors 13-A and 13-B. The planar conductor 13-A defines a portion of the internal capacitor 6B illustrated in FIGS. 2A to 2C. The planar conductor 13-B defines a portion of the internal capacitor 6D illustrated in FIGS. 2A to 2C.

The conductive pattern on the 14th layer is disposed inside the multilayer body 2 and includes linear conductors 14-A, 14-B, 14-C, and 14-D. The linear conductor 14-A defines a portion of the transverse coil 4A illustrated in FIGS. 2A to 2C. The linear conductor 14-B defines a portion of the transverse coil 4B illustrated in FIGS. 2A to 2C. The linear conductor 14-C defines a portion of the transverse coil 4C illustrated in FIGS. 2A to 2C. The linear conductor 14-D defines a portion of the transverse coil 4D illustrated in FIGS. 2A to 2C.

The conductive pattern on the 15th layer is disposed inside the multilayer body 2 and includes linear conductors 15-A, 15-B, 15-C, and 15-D. The linear conductor 15-A defines a portion of the transverse coil 4A illustrated in FIGS. 2A to 2C. The linear conductor 15-B defines a portion of the transverse coil 4B illustrated in FIGS. 2A to 2C. The linear conductor 15-C defines a portion of the transverse coil 4C illustrated in FIGS. 2A to 2C. The linear conductor 15-D defines a portion of the transverse coil 4D illustrated in FIGS. 2A to 2C.

That is, the planar conductor 11-A on the 11th layer is opposed to the planar conductor 10-A on the 10th layer and the planar conductor 12-A on the 12th layer, and they define the internal capacitor 6A illustrated in FIGS. 2A to 2C. The planar conductor 10-A on the 10th layer and the planar conductor 12-A on the 12th layer are electrically connected to each other through the interlayer connection conductors. The planar conductor 13-A on the 13th layer is opposed to the planar conductors 12-A and 12-B on the 12th layer, and they define the internal capacitor 6B illustrated in FIGS. 2A to 2C. The planar conductor 11-B on the 11th layer is opposed to the planar conductor 10-B on the 10th layer and the planar conductor 12-B on the 12th layer and is opposed to the planar conductor 10-C on the 10th layer and the planar conductor 12-C on the 12th layer, and they define the internal capacitor 6C illustrated in FIGS. 2A to 2C. The planar conductor 10-B on the 10th layer and the planar conductor 12-B on the 12th layer are electrically connected to each other through the interlayer connection conductors. The planar conductor 10-C on the 10th layer and the planar conductor 12-C on the 12th layer are electrically connected to each other through the interlayer connection conductors. The planar conductor 13-B on the 13th layer is opposed to the planar conductors 12-C and 12-D on the 12th layer, and they define the internal capacitor 6D illustrated in FIGS. 2A to 2C. The planar conductor 11-C on the 11th layer is opposed to the planar conductor 10-D on the 10th layer and the planar conductor 12-D on the 12th layer, and they define the internal capacitor 6E illustrated in FIGS. 2A to 2C. The planar conductor 10-D on the 10th layer and the planar conductor 12-D on the 12th layer are electrically connected to each other through the interlayer connection conductors.

The linear conductor 5-A on the fifth layer, the linear conductor 15-A on the 15th layer, the linear conductor 6-A on the sixth layer, the linear conductor 14-A on the 14th layer, and the linear conductor 7-A on the seventh layer are spirally connected in sequence through the interlayer connection conductors and define the transverse coil 4A illustrated in FIGS. 2A to 2C. The linear conductor 15-B on the 15th layer, the linear conductor 6-B on the sixth layer, the linear conductor 14-B on the 14th layer, and the linear conductor 7-B on the seventh layer are spirally connected in sequence through the interlayer connection conductors and define the transverse coil 4B illustrated in FIGS. 2A to 2C. The linear conductor 15-C on the 15th layer, the linear conductor 6-C on the sixth layer, the linear conductor 14-C on the 14th layer, and the linear conductor 7-C on the seventh layer are spirally connected in sequence through the interlayer connection conductors and define the transverse coil 4C illustrated in FIGS. 2A to 2C. The linear conductor 5-B on the fifth layer, the linear conductor 15-D on the 15th layer, the linear conductor 6-D on the sixth layer, the linear conductor 14-D on the 14th layer, and the linear conductor 7-D on the seventh layer are spirally connected in sequence through the interlayer connection conductors and define the transverse coil 4D illustrated in FIGS. 2A to 2C.

Each of the linear conductor 8-A on the eighth layer and the linear conductor 9-A on the ninth layer has a loop shape on its conductive layer, and both are helically connected at their respective ends and define the longitudinal coil 5A illustrated in FIGS. 2A to 2C. Each of the linear conductor 8-B on the eighth layer and the linear conductor 9-B on the ninth layer has a loop shape on its conductive layer, and both are helically connected at their respective ends and define the longitudinal coil 5B illustrated in FIGS. 2A to 2C.

Each of the linear conductors 5-A, 7-A, and 14-A in the transverse coil 4A each has a relatively narrow line width, whereas each of the linear conductors 6-A and 15-A has a relatively large line width. Similarly, each of the linear conductors 7-B and 14-B in the transverse coil 4B has a relatively narrow line width, whereas a combination of the linear conductor 6-B and the linear conductor 15-B has a relatively large line width. Each of the linear conductors 7-C and 14-C in the transverse coil 4C has a relatively narrow line width, whereas each of the linear conductors 6-C and 15-C has a relatively large line width. Each of the linear conductors 5-B, 7-D, and 14-D in the transverse coil 4D has a relatively narrow line width, whereas each of the linear conductors 6-D and 15-D has a relatively large line width.

As described above, in each of the transverse coils 4A to 4D, two linear conductors including different turns and being adjacent in the stacking direction have different line widths. Thus, even if there is misregistration or misalignment of linear conductors at the time of manufacturing, an opposed area of the linear conductors is ensured. Additionally, a parasitic capacitance occurring among the transverse coils 4A to 4D and the internal capacitors 6A to 6E is significantly reduced or minimized, and there are minimal variations in effective inductance value of each of the transverse coils 4A to 4D caused by the effect of the parasitic capacitance. Therefore, the inductance value of each of the transverse coils 4A to 4D is ensured.

In the present preferred embodiment, the transverse coils 4A and 4B are wound in different winding directions. The transverse coils 4B and 4C are wound in the same winding direction. The transverse coils 4C and 4D are wound in different winding directions. Each of the spacing between the transverse coils 4A and 4B and that between the transverse coils 4C and 4D is less than that between the transverse coils 4B and 4C. By such adjustment in the winding direction of each of the neighboring ones of the transverse coils 4A to 4D and in the spacing therebetween, the electromagnetic coupling of the transverse coils 4A to 4D is adjusted and, by extension, the inter-resonator coupling of the LC resonant circuits is adjusted and the filter characteristic is effectively controlled. When the internal capacitors 6A to 6E and the longitudinal coils 5A and 5B are arranged within the coil openings of the transverse coils 4A to 4D, as illustrated in the present preferred embodiment, the limitations on the arrangement of the transverse coils 4A to 4D resulting from the internal capacitors 6A to 6E and the longitudinal coils 5A and 5B are reduced or eliminated, and it is easy to change the spacings of the transverse coils 4A to 4D.

Figure 3B:
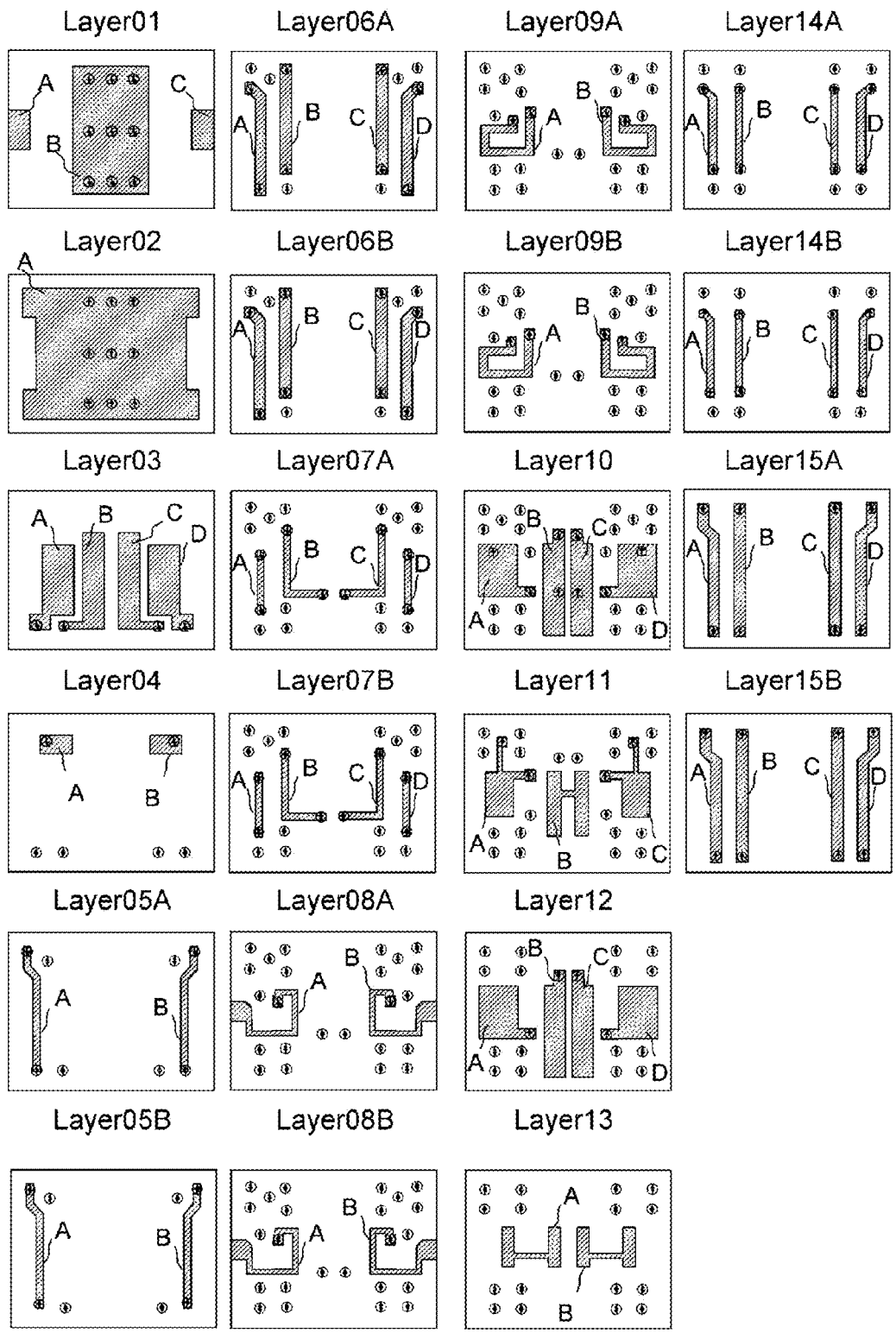
FIG. 3B includes exploded plan views of the high frequency component according to a variation of the first preferred embodiment of the present invention.

FIG. 3B includes exploded plan views of the high frequency component 1 according to a variation of the first preferred embodiment of the present invention. As is clear from a comparison with FIG. 3A, the conductive pattern on the fifth layer illustrated in FIG. 3A is configured as the conductive patterns on two layers of Layer05A and Layer05B in FIG. 3B, and the respective opposite linear conductors in the two conductive patterns are connected in parallel with each other. Similarly, the conductive pattern on the sixth layer illustrated in FIG. 3A is configured as the conductive patterns on two layers of Layer06A and Layer06B in FIG. 3B, and the respective opposite linear conductors in the two conductive patterns are connected in parallel with each other. The conductive pattern on the seventh layer illustrated in FIG. 3A is configured as the conductive patterns on two layers of Layer07A and Layer07B in FIG. 3B, and the respective opposite linear conductors in the two conductive patterns are connected in parallel with each other. The conductive pattern on the eighth layer illustrated in FIG. 3A is configured as the conductive patterns on two layers of Layer08A and Layer08B in FIG. 3B, and the respective opposite linear conductors in the two conductive patterns are connected in parallel with each other. The conductive pattern on the ninth layer illustrated in FIG. 3A is configured as the conductive patterns on two layers of Layer09A and Layer09B in FIG. 3B, and the respective opposite linear conductors in the two conductive patterns are connected in parallel with each other. The conductive pattern on the 14th layer illustrated in FIG. 3A is configured as the conductive patterns on two layers of Layer14A and Layer14B in FIG. 3B, and the respective opposite linear conductors in the two conductive patterns are connected in parallel with each other. The conductive pattern on the 15th layer illustrated in FIG. 3A is configured as the conductive patterns on two layers of Layer15A and Layer15B in FIG. 3B, and the respective opposite linear conductors in the two conductive patterns are connected in parallel with each other.

As described above, in each of the transverse coils 4A to 4D, two linear conductors of the same turn and being adjacent in the stacking direction are connected in parallel with each other through the interlayer connection conductors. Thus, the linear conductors in the transverse coil have a multilayer structure. That increases the effective cross-sectional area of the linear conductors, and the wiring resistance is reduced. Accordingly, the Q values of the series resonant circuits LC1 to LC4, which include the transverse coils 4A to 4D, respectively, are increased.

FIGS. 4A to 4D illustrate a filter characteristic of the high frequency component 1 according to the present preferred embodiment. A high pass filter defined by the high frequency component 1 preferably includes the four-stage serial resonant circuits LC1 to LC4 being inter-resonator coupled and has a filter characteristic having a plurality of attenuation poles adjusted by the inter-resonator coupling.

Figure 4A:
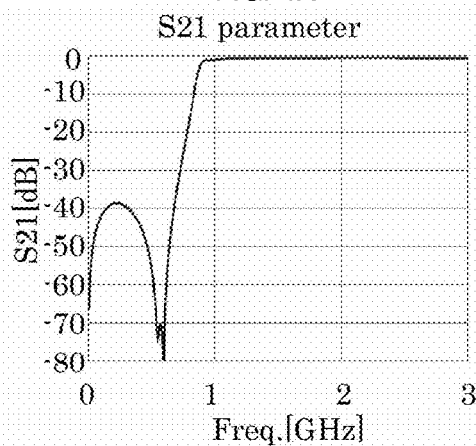
FIGS. 4A to 4D illustrate a filter characteristic of the high frequency component according to the first preferred embodiment of the present invention.
Figure 4C:
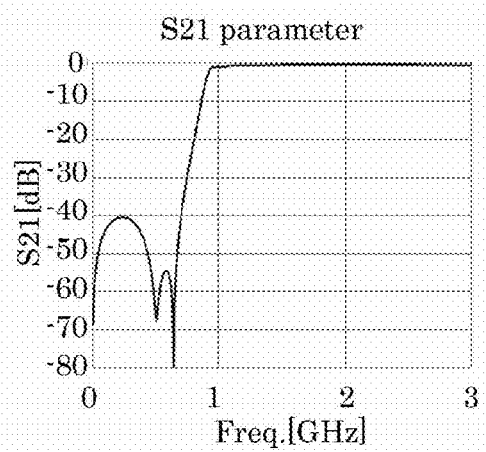
Figure 4B:
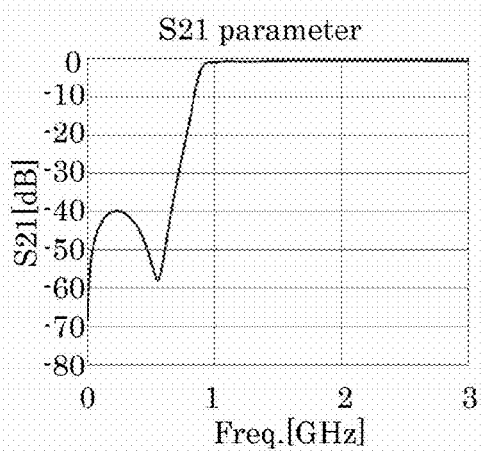

FIGS. 4A to 4C illustrate a filter characteristic when the high frequency component achieves steep attenuation poles. FIG. 4A illustrates the filter characteristic when the transverse coils 4A to 4D are set in the above-described winding directions and the spacings thereof are predetermined. FIG. 4B illustrates the filter characteristic when the spacing between the transverse coils 4B and 4C is less than the setting in FIG. 4A. FIG. 4C illustrates the filter characteristic when the spacing between the transverse coils 4B and 4C is greater than the setting in FIG. 4A. As illustrated in FIGS. 4A to 4C, the depth of each attenuation pole is set by adjusting the inter-resonator coupling using the settings of the spacings of the transverse coils 4A to 4D.

Figure 4D:
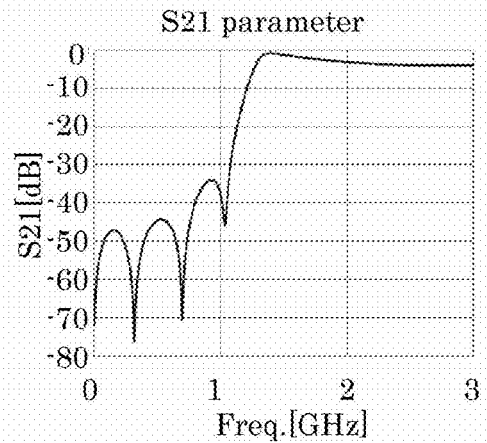

FIG. 4D illustrates the filter characteristic when the coil winding directions of the transverse coils 4A to 4D are different from the settings in FIG. 4A and all of the transverse coils 4A to 4D are wound in the same winding direction. As illustrated in FIGS. 4A and 4D, the intervals of frequencies of the plurality of attenuation poles are changed by adjusting the inter-resonator coupling using the settings of the coil winding directions of the transverse coils 4A to 4D. For example, steep attenuation poles provided by concentrating the plurality of attenuation poles in a narrow frequency band is achieved, or a wide cutoff frequency band provided by widening the intervals of frequencies of the plurality of attenuation poles is achieved.

With the high frequency component 1 according to the present preferred embodiment, the inter-resonator coupling is controlled and the filter characteristic is adjusted by adjustment in the spacing and the coil winding direction of the transverse coils 4A to 4D without adjusting the capacitance of each of the LC resonant circuits.

Next, a high frequency component according to a second preferred embodiment of the present invention is described. The high frequency component according to the second preferred embodiment functions as a low pass filter, which has a cutoff frequency band higher than a pass band.

Figure 5A:
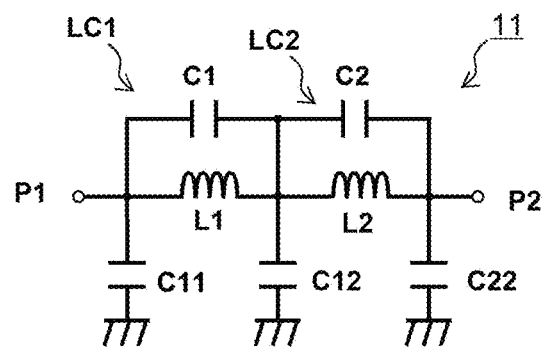
FIG. 5A is an equivalent circuit diagram of a high frequency component according to a second preferred embodiment of the present invention.
Figure 5B:
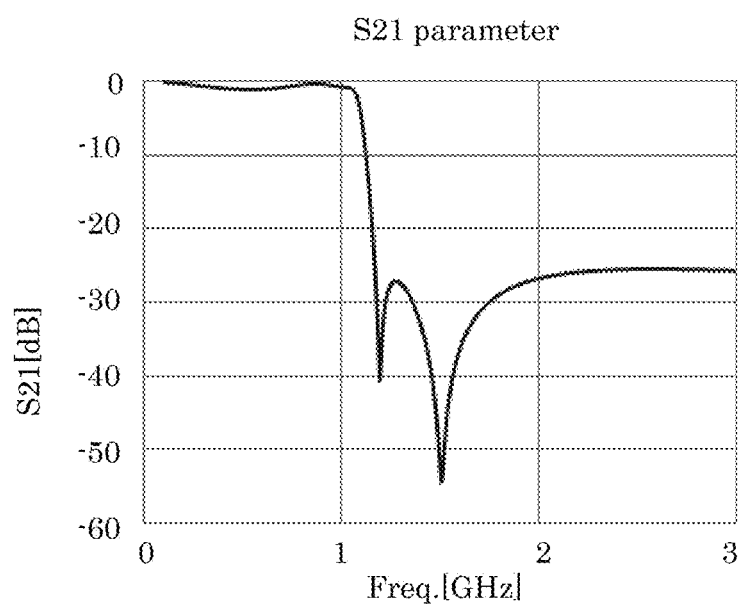
FIG. 5B illustrates a filter characteristic thereof.

FIG. 5A is an equivalent circuit diagram of a high frequency component 11 according to the second preferred embodiment of the present invention. The high frequency component 11 defines a low pass filter including input and output ports P1 and P2, capacitors C1, C2, C11, C12, and C22, and inductors L1 and L2. FIG. 5B illustrates a filter characteristic of the low pass filter.

In the high frequency component 11, the inductor L1 and the capacitor C1 define a parallel resonant circuit LC1, and the inductor L2 and the capacitor C2 define a parallel resonant circuit LC2. The resonant circuits LC1 and LC2 are connected in series between the input port P1 and the output port P2. The capacitor C11 is connected in shunt on the input side of the resonant circuit LC1. The capacitor C12 is connected in shunt on the output side of the resonant circuit LC1 and on the input side of the resonant circuit LC2. The capacitor C22 is connected in shunt on the output side of the resonant circuit LC2.

Figure 6A:
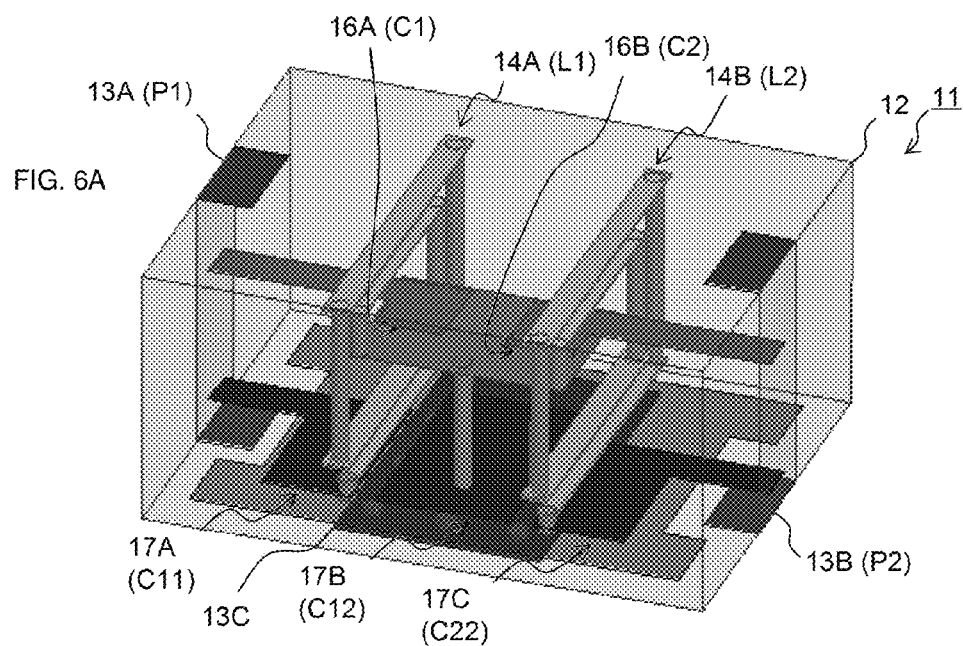
FIG. 6A is a transparent perspective view of the high frequency component according to the second preferred embodiment of the present invention.

FIG. 6A is a transparent perspective view of the high frequency component 11 according to the second preferred embodiment of the present invention.

The high frequency component 11 includes a multilayer body 12. The multilayer body 12 preferably has a rectangular or substantially rectangular parallelepiped shape, for example, and includes a plurality of insulating layers stacked in a stacking direction perpendicular or substantially perpendicular to the bottom surface and the top surface of the multilayer body 12. A linear conductor extending in a direction perpendicular or substantially perpendicular to the stacking direction is disposed between the insulating layers in the multilayer body 12. A planar conductor expanding in a direction perpendicular or substantially perpendicular to the stacking direction is disposed between the insulating layers in the multilayer body 12. An interlayer connection conductor extends in the stacking direction through at least one of the insulating layers in the multilayer body 12. Input and output electrodes 13A and 13B and a ground electrode 13C are disposed on the outer surface of the multilayer body 12. Transverse coils 14A and 14B, internal capacitors 16A and 16B, and external capacitors 17A, 17B, and 17C are disposed inside the multilayer body 12.

The input and output electrode 13A extends from the top surface to the bottom surface through the left side surface of the multilayer body 12. The input and output electrode 13B extends from the top surface to the bottom surface through the right side surface of the multilayer body 12. The ground electrode 13C is disposed on the bottom surface of the multilayer body 12.

The transverse coils 14A and 14B are arranged in sequence from the left side surface toward the right side surface inside the multilayer body 12. Each of the transverse coils 14A and 14B includes at least three interlayer connection conductors and at least three linear conductors are connected together. Each of the transverse coils 14A and 14B includes a plurality of turns spirally wound around a winding axis extending in a direction perpendicular or substantially perpendicular to the stacking direction of the insulating layers in the multilayer body 12, and more specifically, around a winding axis extending in a direction connecting the left side surface and the right side surface of the multilayer body 12 in a plane that is perpendicular or substantially perpendicular to the top surface and the bottom surface of the multilayer body 12 and that is parallel or substantially parallel to the left side surface and the right side surface.

The internal capacitors 16A and 16B are arranged in sequence from the left side surface toward the right side surface inside the multilayer body 12. Each of the internal capacitors 16A and 16B includes planar conductors parallel or substantially parallel to the top surface and the bottom surface of the multilayer body 12 that are opposed to each other such that at least one of the insulating layers is disposed therebetween.

The external capacitors 17A, 17B, and 17C are arranged in sequence from the left side surface toward the right side surface inside the multilayer body 12. Each of the external capacitors 17A, 17B, and 17C includes planar conductors parallel or substantially parallel to the top surface and the bottom surface of the multilayer body 12 that are opposed to each other such that at least one of the insulating layers is disposed therebetween. One of the planar conductors in each of the external capacitors 17A, 17B, and 17C is a ground electrode GND, which is a common electrode.

Correspondences between the configurations in the multilayer body 12 and the circuit elements in the circuitry illustrated in FIG. 5A are described below. The input and output electrodes 13A and 13B correspond to the input and output ports P1 and P2 in FIG. 5A, respectively. The transverse coils 14A and 14B correspond to the inductors L1 and L2 for resonance in FIG. 5A, respectively. The internal capacitors 16A and 16B correspond to the capacitors C1 and C2 for resonance in FIG. 5A, respectively. The external capacitors 17A, 17B, and 17C correspond to the capacitors C11, C12, and C22 in FIG. 5A, respectively.

Figure 6B:
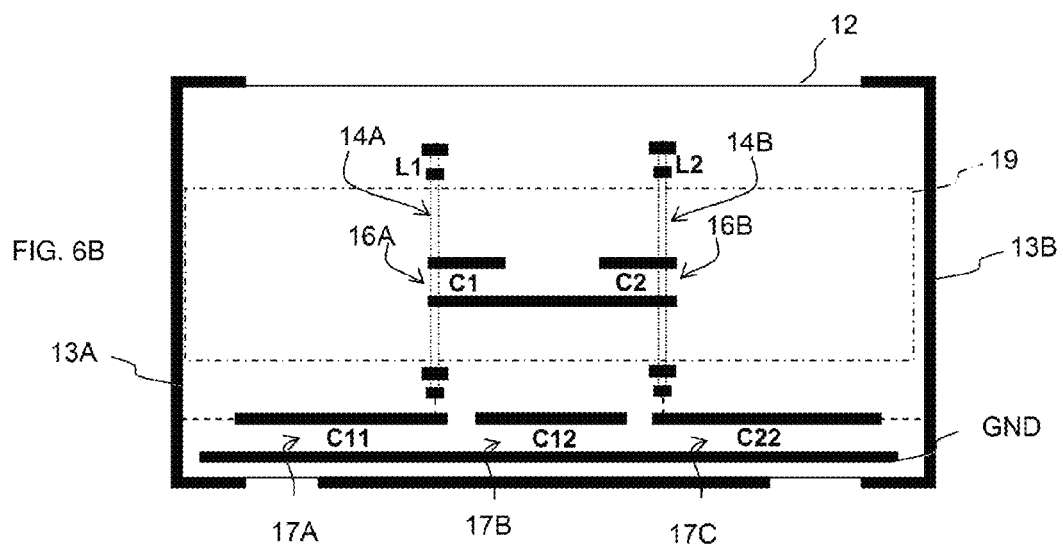
FIG. 6B is a schematic cross-sectional view thereof.

FIG. 6B is a schematic cross-sectional view that illustrates the arrangement of the transverse coils 14A and 14B, the internal capacitors 16A and 16B, and the external capacitors 17A to 17C in the multilayer body 12. FIG. 6B is a cross-sectional view of the multilayer body 12 taken along a plane parallel or substantially parallel to the front surface and the back surface of the multilayer body 12.

In the neighboring transverse coils 14A and 14B, the coil openings are opposed to each other. When the multilayer body 12 is viewed along the winding axis of each of the transverse coils 14A and 14B from the left side surface or the right side surface in a transparent manner, the coil openings of the transverse coils 14A and 14B overlap each other and coincide with each other. Accordingly, the transverse coils 14A and 14B are electromagnetically coupled to each other. A region in the multilayer body 12 where the coil openings of the transverse coils 14A and 14B overlap each other when the multilayer body 12 is viewed from the left side surface or the right side surface of the multilayer body 12 in a transparent manner is indicated as an internal region 19 in FIG. 6B.

In the above-described configuration, the internal capacitors 16A and 16B are arranged in the internal region 19, that is, the coil openings of the transverse coils 14A and 14B. Thus, it is not necessary provide a space to accommodate the internal capacitors 16A and 16B in a region outside the coil openings of the transverse coils 14A and 14B in the multilayer body 12, the base area of the multilayer body 12 and the number of the insulating layers are reduced, and the multilayer body 12 is miniaturized. Alternatively, an increase in the number of turns of each of the transverse coils 14A and 14B or an increase in the size of each of the coil openings thereof enables an increase in the inductance of each of the transverse coils 14A and 14B.

The external capacitors 17A to 17C define the capacitors C11, C12, and C22. Alternatively, internal capacitors may define the capacitors C11, C12, and C22. When the capacitance of each of the capacitors C11, C12, and C22 is large, a large electrode area is required. Thus, if the internal capacitors define the capacitors C11, C12, and C22, unnecessary coupling occurring between the capacitors C11, C12, and C22 and the transverse coils 14A and 14B is relatively large, and this may degrade the coil characteristics of the transverse coils 14A and 14B and the filter characteristic dependent on the resonant circuits LC1 and LC2. To address that issue, in the present preferred embodiment, the external capacitors 17A to 17C define the capacitors C11, C12, and C22 in order to prevent degradation in the coil characteristics of the transverse coils 14A and 14B and in the filter characteristic dependent on the resonant circuits LC1 and LC2.

With the above-described configuration, the connection wiring required to connect the transverse coils 14A and 14B and the internal capacitors 16A and 16B is shortened. This reduces degradation in the coil characteristics of the transverse coils 14A and 14B and in the filter characteristic dependent on the resonant circuits LC1 and LC2, the degradation being caused by a parasitic inductance or a parasitic capacitance occurring in the connection wiring.

Figure 7:
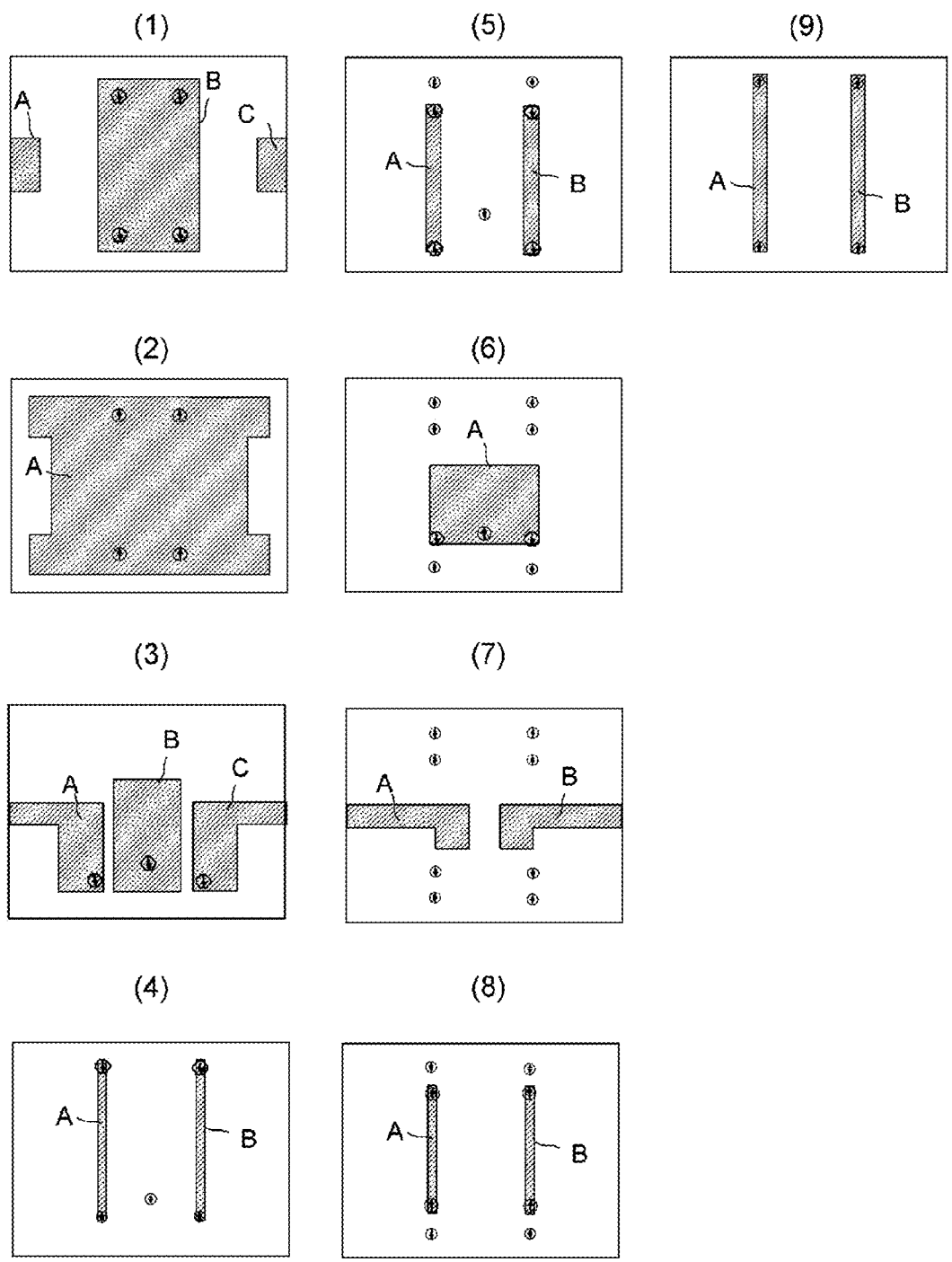
FIG. 7 includes exploded plan views of the high frequency component according to the second preferred embodiment of the present invention.

FIG. 7 includes exploded plan views of the multilayer body 12 and illustrates conductive patterns (linear conductors and planar conductors) on the insulating layers in the multilayer body 12 in the high frequency component 11. In FIG. 7, the conductive patterns on the first to ninth layers are illustrated in sequence from the bottom surface toward the top surface of the multilayer body 12.

The conductive pattern on the first layer is exposed to the bottom surface of the multilayer body 12 and includes planar conductors 1-A, 1-B, and 1-C. The planar conductor 1-A defines a portion of the input and output electrode 13A illustrated in FIGS. 6A and 6B. The planar conductor 1-B defines the ground electrode 13C illustrated in FIGS. 6A and 6B. The planar conductor 1-C defines a portion of the input and output electrode 13B illustrated in FIGS. 6A and 6B.

The conductive pattern on the second layer is disposed inside the multilayer body 12 and includes a planar conductor 2-A. The planar conductor 2-A is connected to the planar conductor 1-B (ground electrode 13C) through the interlayer connection conductors and defines the ground electrode GND.

The conductive pattern on the third layer is disposed inside the multilayer body 12 and includes planar conductors 3-A, 3-B, and 3-C. The planar conductor 3-A is opposed to the planar conductor 2-A, and they define the external capacitor 17A illustrated in FIGS. 6A and 6B. The planar conductor 3-B is opposed to the planar conductor 2-A, and they define the external capacitor 17B illustrated in FIGS. 6A and 6B. The planar conductor 3-C is opposed to the planar conductor 2-A, and they define the external capacitor 17C illustrated in FIGS. 6A and 6B.

The conductive pattern on the fourth layer is disposed inside the multilayer body 12 and includes linear conductors 4-A and 4-B. The linear conductor 4-A defines a portion of the transverse coil 14A illustrated in FIGS. 6A and 6B. The linear conductor 4-B defines a portion of the transverse coil 14B illustrated in FIGS. 6A and 6B.

The conductive pattern on the fifth layer is disposed inside the multilayer body 12 and includes linear conductors 5-A and 5-B. The linear conductor 5-A defines a portion of the transverse coil 14A illustrated in FIGS. 6A and 6B. The linear conductor 5-B defines a portion of the transverse coil 14B illustrated in FIGS. 6A and 6B.

The conductive pattern on the sixth layer is disposed inside the multilayer body 12 and includes a planar conductor 6-A. The planar conductor 6-A defines a portion of the internal capacitor 16A and a portion of the internal capacitor 16B illustrated in FIGS. 6A and 6B.

The conductive pattern on the seventh layer is disposed inside the multilayer body 12 and includes planar conductors 7-A and 7-B. The planar conductor 7-A defines a portion of the internal capacitor 16A illustrated in FIGS. 6A and 6B. The planar conductor 7-B defines a portion of the internal capacitor 16B illustrated in FIGS. 6A and 6B.

The conductive pattern on the eighth layer is disposed inside the multilayer body 12 and includes linear conductors 8-A and 8-B. The linear conductor 8-A defines a portion of the transverse coil 14A illustrated in FIGS. 6A and 6B. The linear conductor 8-B defines a portion of the transverse coil 14B illustrated in FIGS. 6A and 6B.

The conductive pattern on the ninth layer is disposed inside the multilayer body 12 and includes linear conductors 9-A and 9-B. The linear conductor 9-A defines a portion of the transverse coil 14A illustrated in FIGS. 6A and 6B. The linear conductor 9-B defines a portion of the transverse coil 14B illustrated in FIGS. 6A and 6B.

That is, the planar conductor 6-A on the sixth layer is opposed to the planar conductor 7-A on the seventh layer, and they define the internal capacitor 16A illustrated in FIGS. 6A and 6B. The planar conductor 6-A on the sixth layer is opposed to the planar conductor 7-B on the seventh layer, and they define the internal capacitor 16B illustrated in FIGS. 6A and 6B.

The linear conductor 4-A on the fourth layer, the linear conductor 9-A on the ninth layer, the linear conductor 5-A on the fifth layer, and the linear conductor 8-A on the eighth layer are spirally connected in sequence through the interlayer connection conductors and define the transverse coil 14A illustrated in FIGS. 6A and 6B. The linear conductor 4-B on the fourth layer, the linear conductor 9-B on the ninth layer, the linear conductor 5-B on the fifth layer, and the linear conductor 8-B on the eighth layer are spirally connected in sequence through the interlayer connection conductors and define the transverse coil 14B illustrated in FIGS. 6A and 6B.

In the second preferred embodiment, in each of the transverse coils 14A and 14B, two linear conductors including different turns and being adjacent in the stacking direction also have different line widths. Thus, even if there is misregistration or misalignment of linear conductors at the time of manufacturing, an opposed area of the linear conductors is ensured. Therefore, the inductance value of each of the transverse coils 14A and 14B is ensured.

Any one or all of the linear conductors may have a multilayer structure. In that case, an effective cross-sectional area of the linear conductors is increased, and thus the wiring resistance is significantly reduced or minimized. Accordingly, the Q values of the resonant circuits LC1 and LC2, which include the transverse coils 14A and 14B, respectively, are effectively increased.

Next, a high frequency component according to a third preferred embodiment of the present invention will be described. The high frequency component illustrated here preferably functions as a band pass filter having cutoff frequency bands higher and lower than a pass band.

Figure 8A:
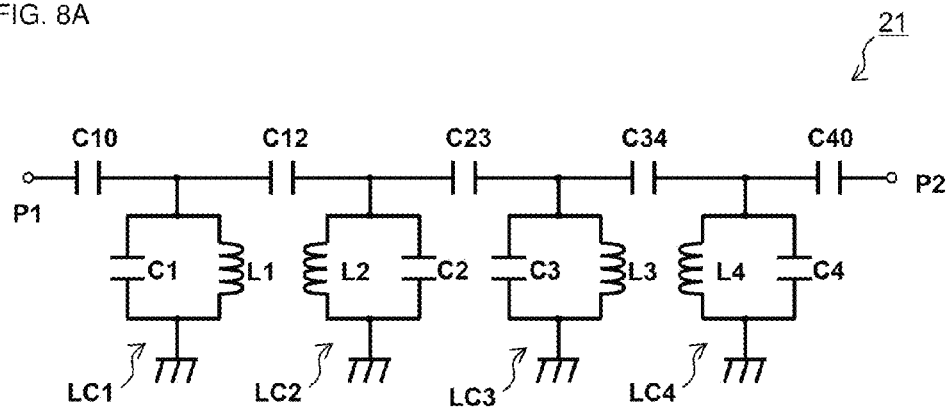
FIG. 8A is an equivalent circuit diagram of a high frequency component according to a third preferred embodiment of the present invention.
Figure 8B:
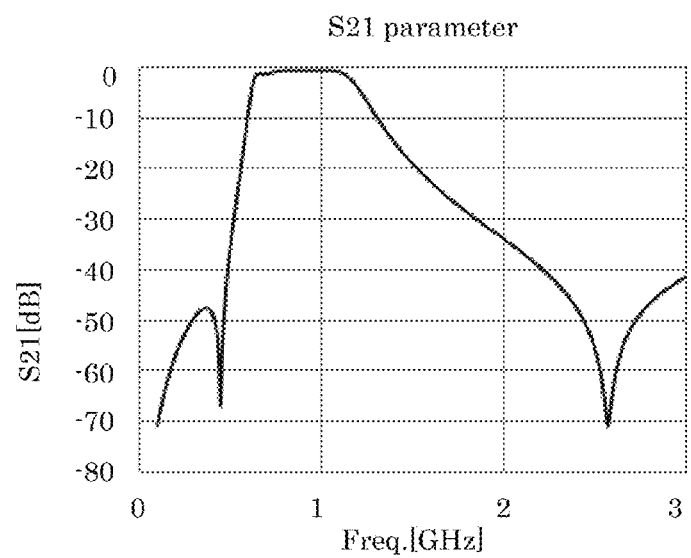
FIG. 8B illustrates a filter characteristic thereof.

FIG. 8A is an equivalent circuit diagram of a high frequency component 21 according to the third preferred embodiment. The high frequency component 21 defines and functions as a band pass filter including input and output ports P1 and P2, capacitors C1, C2, C3, C4, C10, C12, C23, C34, and C40, and inductors L1, L2, L3, and L4. FIG. 8B illustrates a filter characteristic of the high frequency component 21.

In the high frequency component 21, the inductor L1 and the capacitor C1 define a parallel resonant circuit LC1. Similarly, the inductor L2 and the capacitor C2 define a parallel resonant circuit LC2. The inductor L3 and the capacitor C3 define a parallel resonant circuit LC3. The inductor L4 and the capacitor C4 define a parallel resonant circuit LC4. The capacitor C12 is connected between the resonant circuits LC1 and LC2. Similarly, the capacitor C23 is connected between the resonant circuits LC2 and LC3. The capacitor C34 is connected between the resonant circuits LC3 and LC4. The above-described circuitry portion defines a basic circuit of the band pass filter in which the four-stage resonant circuits are coupled together through the capacitors.

Among the four-stage resonant circuits LC1 to LC4 defining the band pass filter, the parallel resonant circuit LC1 is an input-stage resonant circuit and is coupled to the input port P1 through the capacitor C10 for external coupling. The parallel resonant circuit LC2 is an intermediate-stage (second-stage) resonant circuit and is coupled to the input-stage parallel resonant circuit LC1 through the capacitor C12. The parallel resonant circuit LC3 is an intermediate-stage (third-stage) resonant circuit and is coupled to the second-stage parallel resonant circuit LC2 through the capacitor C23. The parallel resonant circuit LC4 is an output-stage resonant circuit, is coupled to the third-stage parallel resonant circuit LC3 through the capacitor C34, and is coupled to the output port P2 through the capacitor C40 for external coupling.

That is, in the high frequency component 21, the inductors L1, L2, L3, and L4 function as inductors for resonance in the resonant circuits LC1, LC2, LC3, and LC4, respectively. The capacitors C1, C2, C3, and C4 function as capacitors for resonance in the resonant circuits LC1, LC2, LC3, and LC4, respectively. The capacitors C12, C23, and C34 function as capacitors for inter-resonator coupling connecting the resonant circuits LC1, LC2, LC3, and LC4. The capacitors C10 and C40 function as capacitors for external coupling between the resonant circuits LC1, LC2, LC3, and LC4 and the input and output ports P1 and P2.

Among the resonant circuits LC1 to LC4, the adjacent resonant circuits LC1 and LC2 are electromagnetically coupled to each other. Similarly, the resonant circuits LC3 and LC4 are electromagnetically coupled to each other. That is, the inductors L1 and L2 are electromagnetically coupled to each other, and the inductors L3 and L4 are electromagnetically coupled to each other.

Figure 9A:
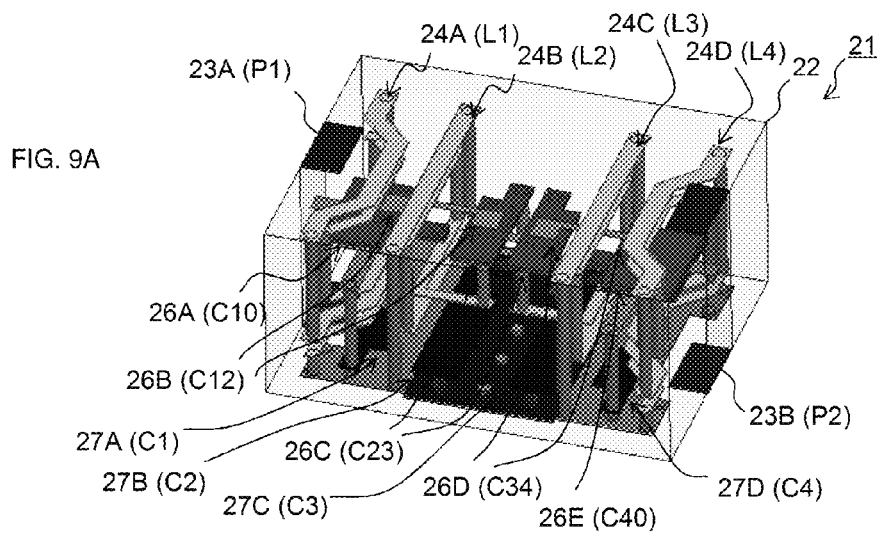
FIG. 9A is a transparent perspective view of the high frequency component according to the third preferred embodiment of the present invention.

FIG. 9A is a transparent perspective view of the high frequency component 21 according to the third preferred embodiment of the present invention.

The high frequency component 21 includes a multilayer body 22. The multilayer body 22 preferably has a rectangular or substantially rectangular parallelepiped shape, for example, and includes a plurality of insulating layers stacked in a stacking direction perpendicular or substantially perpendicular to the bottom surface and the top surface of the multilayer body 22. A linear conductor extending in a direction perpendicular or substantially perpendicular to the stacking direction is disposed between the insulating layers in the multilayer body 22. A planar conductor expanding in a direction perpendicular or substantially perpendicular to the stacking direction is disposed between the insulating layers in the multilayer body 22. An interlayer connection conductor extends in the stacking direction through at least one of the insulating layers in the multilayer body 22. Input and output electrodes 23A and 23B and a ground electrode 23C are disposed on the outer surface of the multilayer body 22. Transverse coils 24A, 24B, 24C, and 24D, internal capacitors 26A, 26B, 26C, 26D, and 26E, and external capacitors 27A, 27B, 27C, and 27D are disposed inside the multilayer body 22.

The input and output electrode 23A extends from the top surface to the bottom surface through the left side surface of the multilayer body 22. The input and output electrode 23B extends from the top surface to the bottom surface through the right side surface of the multilayer body 22. The ground electrode 23C is disposed on the bottom surface of the multilayer body 22.

The transverse coils 24A, 24B, 24C, and 24D are arranged in sequence from the left side surface toward the right side surface inside the multilayer body 22. Each of the transverse coils 24A, 24B, 24C, and 24D includes at least three interlayer connection conductors and at least three linear conductors are connected together. Each of the transverse coils 24A, 24B, 24C, and 24D includes a plurality of turns spirally wound around a winding axis extending in a direction perpendicular or substantially perpendicular to the stacking direction of the insulating layers in the multilayer body 22, more specifically, around a winding axis extending in a direction connecting the left side surface and the right side surface of the multilayer body 22 in a plane that is perpendicular or substantially perpendicular to the top surface and the bottom surface of the multilayer body 22 and that is parallel or substantially parallel to the left side surface and the right side surface.

The internal capacitors 26A, 26B, 26C, 26D, and 26E are arranged in sequence from the left side surface toward the right side surface inside the multilayer body 22. Each of the internal capacitors 26A, 26B, 26C, 26D, and 26E includes planar conductors parallel or substantially parallel to the top surface and the bottom surface of the multilayer body 22 that are opposed to each other such that at least one of the insulating layers is disposed therebetween.

The external capacitors 27A, 27B, 27C, and 27D are arranged in sequence from the left side surface toward the right side surface inside the multilayer body 22. Each of the external capacitors 27A, 27B, 27C, and 27D includes planar conductors parallel or substantially parallel to the top surface and the bottom surface of the multilayer body 22 that are opposed to each other such that at least one of the insulating layers is disposed therebetween. One of the planar conductors in each of the external capacitors 27A, 27B, 27C, and 27D is a ground electrode GND, which is a common electrode.

Correspondences between the configurations in the multilayer body 22 and the circuit elements in the circuitry illustrated in FIG. 8A are described below. The input and output electrode 23A corresponds to the input port P1 in FIG. 8A. The input and output electrode 23B corresponds to the output port P2 in FIG. 8A. The transverse coils 24A, 24B, 24C, and 24D correspond to the inductors for resonance L1, L2, L3, and L4 in FIG. 8A, respectively. The internal capacitors 26B, 26C, and 26D correspond to the capacitors C12, C23, and C34 for inter-resonator coupling in FIG. 8A, respectively. The internal capacitors 26A and 26E correspond to the capacitors C10 and C40 for external coupling in FIG. 8A, respectively. The external capacitors 27A, 27B, 27C, and 27D correspond to the capacitors C1, C2, C3, and C4 for resonance in FIG. 8A, respectively.

Figure 9B:
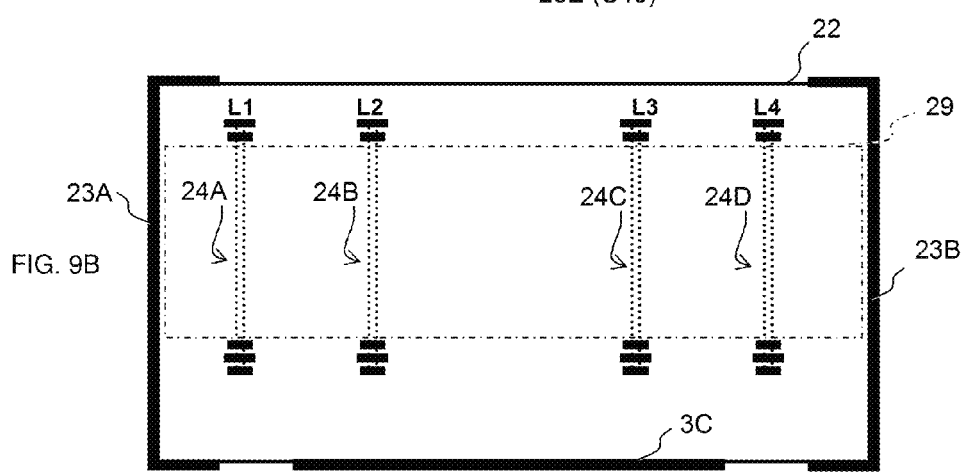
FIGS. 9B and 9C are schematic cross-sectional views thereof.
Figure 9C:
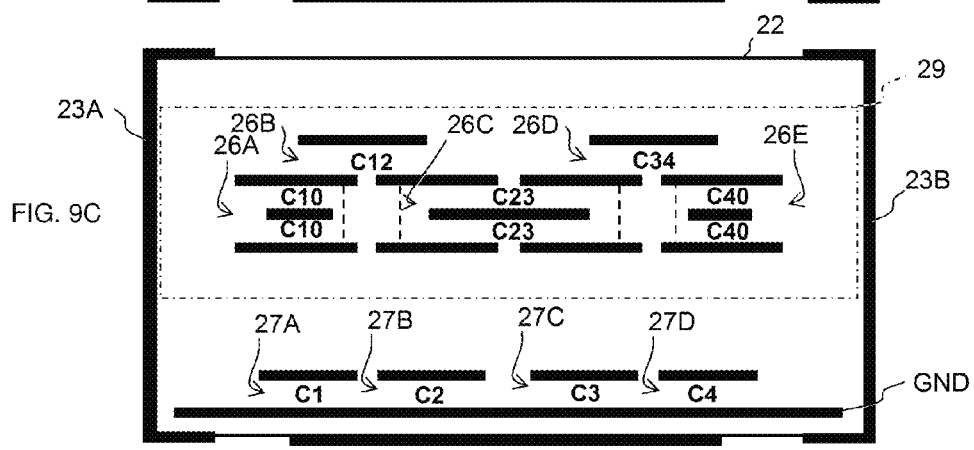

FIG. 9B is a schematic cross-sectional view that illustrates the arrangement of the transverse coils 24A to 24D in the multilayer body 22. FIG. 9C is a schematic cross-sectional view that illustrates the arrangement of the internal capacitors 26A to 26E and the external capacitors 27A to 27D in the multilayer body 22. Each of FIGS. 9B and 9C is a cross-sectional view of the multilayer body 22 taken along a plane parallel or substantially parallel to the front surface and the back surface of the multilayer body 22.

In the neighboring transverse coils of the transverse coils 24A to 24D, the coil openings are opposed to each other. When the multilayer body 22 is viewed along the winding axis of each of the transverse coils 24A to 24D from the left side surface or the right side surface in a transparent manner, the coil openings of the transverse coils 24A to 24D overlap each other and coincide with each other. Accordingly, the transverse coils 24A to 24D are electromagnetically coupled to each other. A region in the multilayer body 22 where the coil openings of the transverse coils 24A to 24D overlap each other when the multilayer body 22 is viewed from the left side surface or the right side surface of the multilayer body 22 in a transparent manner is indicated as an internal region 29 in FIGS. 9B and 9C.

In the above-described configuration, the internal capacitors 26A to 26E are arranged in the internal region 29, that is, the coil openings of the transverse coils 24A to 24D. Thus, it is not necessary to provide a space to accommodate the internal capacitors 26A to 26E in a region outside the coil openings of the transverse coils 24A to 24D in the multilayer body 22, the base area of the multilayer body 22 and the number of the insulating layers is reduced, and the multilayer body 22 is miniaturized. Alternatively, an increase in the number of turns of each of the transverse coils 24A to 24D or an increase in the size of each of the coil openings enables an increase in the inductance of each of the transverse coils 24A to 24D.

Here, the external capacitors 27A to 27D define the capacitors C1 to C4 for resonance. Alternatively, internal capacitors may define the capacitors C1 to C4 for resonance. When the capacitance of each of the capacitors C1 to C4 for resonance is relatively large, a large electrode area is required. Thus, if the internal capacitors define the capacitors C1 to C4 for resonance, unnecessary coupling occurring among the capacitors C1 to C4 for resonance and the transverse coils 24A to 24D is relatively large, and this may degrade the coil characteristics of the transverse coils 24A to 24D and the filter characteristic dependent on the resonant circuits LC1 to LC4. To address this issue, in the present preferred embodiment, the external capacitors 27A to 27D define the capacitors C1 to C4 for resonance in order to prevent degradation in the coil characteristics of the transverse coils 24A to 24D and in the filter characteristic dependent on the resonant circuits LC1 to LC4.

With the above-described configuration, the connection wiring required for connecting the transverse coils 24A to 24D and the internal capacitors 26A to 26E is shortened. This significantly reduces or prevents degradation in the coil characteristics of the transverse coils 24A to 24D and in the filter characteristic dependent on the resonant circuits LC1 to LC4, the degradation being caused by a parasitic inductance or a parasitic capacitance occurring in the connection wiring.

Figure 10:
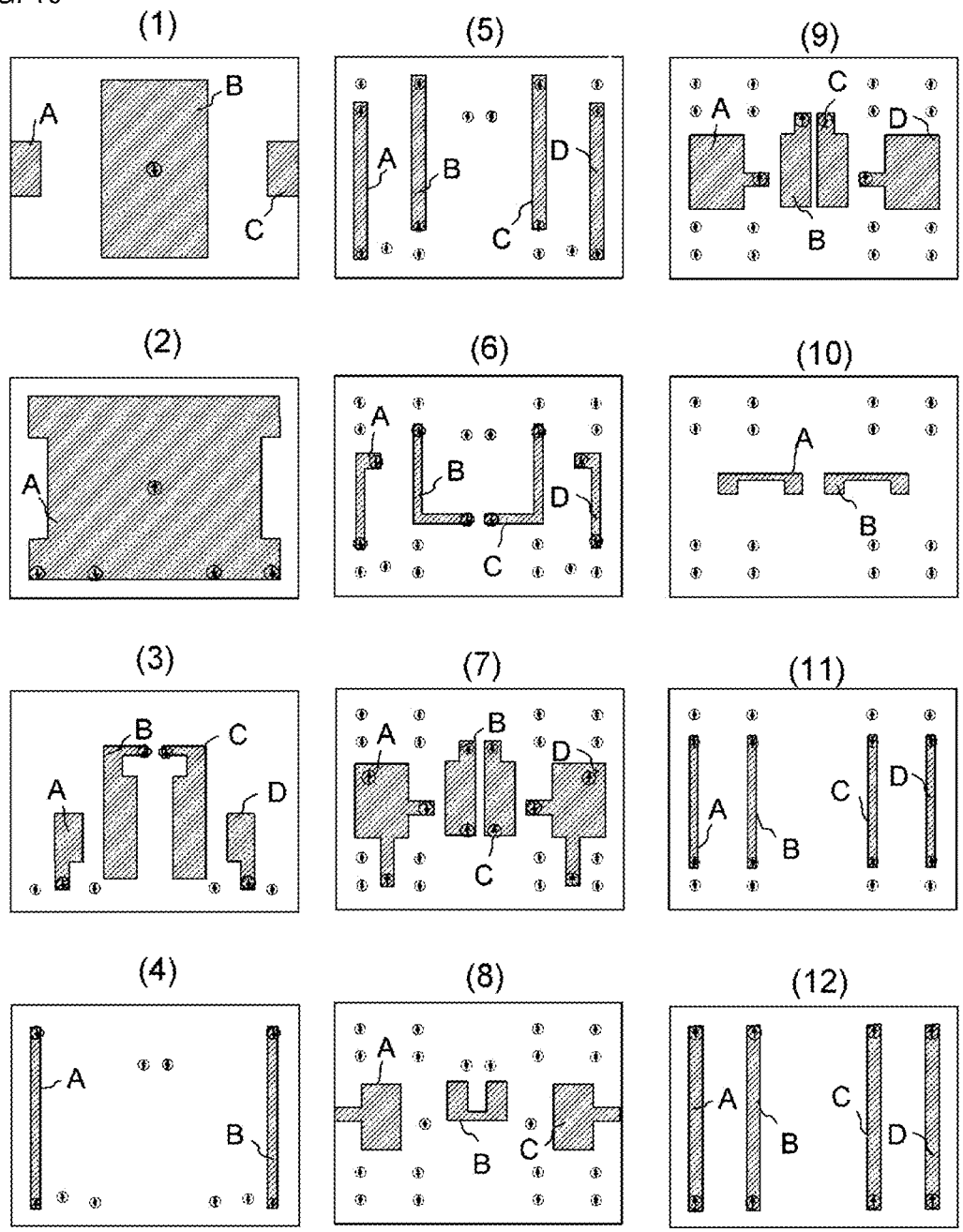
FIG. 10 includes exploded plan views of the high frequency component according to the third preferred embodiment of the present invention.

FIG. 10 includes exploded plan views of the multilayer body 22 and illustrates conductive patterns (linear conductors and planar conductors) on the insulating layers in the multilayer body 22 in the high frequency component 21. In FIG. 10, the conductive patterns on the first to twelfth layers are illustrated in sequence from the bottom surface toward the top surface of the multilayer body 22.

The conductive pattern on the first layer is exposed to the bottom surface of the multilayer body 22 and includes planar conductors 1-A, 1-B, and 1-C. The planar conductor 1-A defines a portion of the input and output electrode 23A illustrated in FIGS. 9A to 9C. The planar conductor 1-B defines the ground electrode 23C illustrated in FIGS. 9A to 9C. The planar conductor 1-C defines a portion of the input and output electrode 23B illustrated in FIGS. 9A to 9C.

The conductive pattern on the second layer is disposed inside the multilayer body 22 and includes a planar conductor 2-A. The planar conductor 2-A is connected to the planar conductor 1-B (ground electrode 23C) through the interlayer connection conductor and defines the ground electrode GND.

The conductive pattern on the third layer is disposed inside the multilayer body 22 and includes planar conductors 3-A, 3-B, 3-C, and 3-D. The planar conductor 3-A is opposed to the planar conductor 2-A, and they define the external capacitor 27A illustrated in FIGS. 9A to 9C. The planar conductor 3-B is opposed to the planar conductor 2-A, and they define the external capacitor 27B illustrated in FIGS. 9A to 9C. The planar conductor 3-C is opposed to the planar conductor 2-A, and they define the external capacitor 27C illustrated in FIGS. 9A to 9C. The planar conductor 3-D is opposed to the planar conductor 2-A, and they define the external capacitor 27D illustrated in FIGS. 9A to 9C.

The conductive pattern on the fourth layer is disposed inside the multilayer body 22 and includes linear conductors 4-A and 4-B. The linear conductor 4-A defines a portion of the transverse coil 24A illustrated in FIGS. 9A to 9C. The linear conductor 4-B defines a portion of the transverse coil 24D illustrated in FIGS. 9A to 9C.

The conductive pattern on the fifth layer is disposed inside the multilayer body 22 and includes linear conductors 5-A, 5-B, 5-C, and 5-D. The linear conductor 5-A defines a portion of the transverse coil 24A illustrated in FIGS. 9A to 9C. The linear conductor 5-B defines a portion of the transverse coil 24B illustrated in FIGS. 9A to 9C. The linear conductor 5-C defines a portion of the transverse coil 24C illustrated in FIGS. 9A to 9C. The linear conductor 5-D defines a portion of the transverse coil 24D illustrated in FIGS. 9A to 9C.

The conductive pattern on the sixth layer is disposed inside the multilayer body 22 and includes linear conductors 6-A, 6-B, 6-C, and 6-D. The linear conductor 6-A defines a portion of the transverse coil 24A illustrated in FIGS. 9A to 9C. The linear conductor 6-B defines a portion of the transverse coil 24B illustrated in FIGS. 9A to 9C. The linear conductor 6-C defines a portion of the transverse coil 24C illustrated in FIGS. 9A to 9C. The linear conductor 6-D defines a portion of the transverse coil 24D illustrated in FIGS. 9A to 9C.

The conductive pattern on the seventh layer is disposed inside the multilayer body 22 and includes planar conductors 7-A, 7-B, 7-C, and 7-D. The planar conductor 7-A defines a portion of the internal capacitor 26A illustrated in FIGS. 9A to 9C. The planar conductor 7-B defines a portion of the internal capacitor 26C illustrated in FIGS. 9A to 9C. The planar conductor 7-C defines a portion of the internal capacitor 26C illustrated in FIGS. 9A to 9C. The planar conductor 7-D defines a portion of the internal capacitor 26E illustrated in FIGS. 9A to 9C.

The conductive pattern on the eighth layer is disposed inside the multilayer body 22 and includes planar conductors 8-A, 8-B, and 8-C. The planar conductor 8-A defines a portion of the internal capacitor 26A illustrated in FIGS. 9A to 9C. The planar conductor 8-B defines a portion of the internal capacitor 26C illustrated in FIGS. 9A to 9C. The planar conductor 8-C defines a portion of the internal capacitor 26E illustrated in FIGS. 9A to 9C.

The conductive pattern on the ninth layer is disposed inside the multilayer body 22 and includes planar conductors 9-A, 9-B, 9-C, and 9-D. The planar conductor 9-A defines a portion of the internal capacitor 26A and a portion of the internal capacitor 26B illustrated in FIGS. 9A to 9C. The planar conductor 9-B defines a portion of the internal capacitor 26C and a portion of the internal capacitor 26B illustrated in FIGS. 9A to 9C. The planar conductor 9-C defines a portion of the internal capacitor 26C and a portion of the internal capacitor 26D illustrated in FIGS. 9A to 9C. The planar conductor 9-D defines a portion of the internal capacitor 26E and a portion of the internal capacitor 26D illustrated in FIGS. 9A to 9C.

The conductive pattern on the 10th layer is disposed inside the multilayer body 22 and includes planar conductors 10-A and 10-B. The planar conductor 10-A defines a portion of the internal capacitor 26B illustrated in FIGS. 9A to 9C. The planar conductor 10-B defines a portion of the internal capacitor 26D illustrated in FIGS. 9A to 9C.

The conductive pattern on the 11th layer is disposed inside the multilayer body 22 and includes linear conductors 11-A, 11-B, 11-C, and 11-D. The linear conductor 11-A defines a portion of the transverse coil 24A illustrated in FIGS. 9A to 9C. The linear conductor 11-B defines a portion of the transverse coil 24B illustrated in FIGS. 9A to 9C. The linear conductor 11-C defines a portion of the transverse coil 24C illustrated in FIGS. 9A to 9C. The linear conductor 11-D defines a portion of the transverse coil 24D illustrated in FIGS. 9A to 9C.

The conductive pattern on the 12th layer is disposed inside the multilayer body 22 and includes linear conductors 12-A, 12-B, 12-C, and 12-D. The linear conductor 12-A defines a portion of the transverse coil 24A illustrated in FIGS. 9A to 9C. The linear conductor 12-B defines a portion of the transverse coil 24B illustrated in FIGS. 9A to 9C. The linear conductor 12-C defines a portion of the transverse coil 24C illustrated in FIGS. 9A to 9C. The linear conductor 12-D defines a portion of the transverse coil 24D illustrated in FIGS. 9A to 9C.

That is, the planar conductor 8-A on the eighth layer is opposed to the planar conductor 7-A on the seventh layer and the planar conductor 9-A on the ninth layer, and they define the internal capacitor 26A illustrated in FIGS. 9A to 9C. The planar conductor 7-A on the seventh layer and the planar conductor 9-A on the ninth layer are electrically connected to each other through the interlayer connection conductors. The planar conductor 10-A on the 10th layer is opposed to the planar conductors 9-A and 9-B on the ninth layer, and they define the internal capacitor 26B illustrated in FIGS. 9A to 9C. The planar conductor 8-B on the eighth layer is opposed to the planar conductors 7-B and 7-C on the seventh layer and the planar conductors 9-B and 9-C on the ninth layer, and they define the internal capacitor 26C illustrated in FIGS. 9A to 9C. The planar conductor 7-B on the seventh layer and the planar conductor 9-B on the ninth layer are electrically connected to each other through the interlayer connection conductors. The planar conductor 7-C on the seventh layer and the planar conductor 9-C on the ninth layer are electrically connected to each other through the interlayer connection conductors. The planar conductor 10-B on the 10th layer is opposed to the planar conductors 9-C and 9-D on the ninth layer, and they define the internal capacitor 26D illustrated in FIGS. 9A to 9C. The planar conductor 8-C on the eighth layer is opposed to the planar conductor 7-D on the seventh layer and the planar conductor 9-D on the ninth layer, and they define the internal capacitor 26E illustrated in FIGS. 9A to 9C. The planar conductor 7-D on the seventh layer and the planar conductor 9-D on the ninth layer are electrically connected to each other through the interlayer connection conductors.

The linear conductor 4-A on the fourth layer, the linear conductor 12-A on the 12th layer, the linear conductor 5-A on the fifth layer, the linear conductor 11-A on the 11th layer, and the linear conductor 6-A on the sixth layer are spirally connected in sequence through the interlayer connection conductors and define the transverse coil 24A illustrated in FIGS. 9A to 9C. The linear conductor 12-B on the 12th layer, the linear conductor 5-B on the fifth layer, the linear conductor 11-B on the 11th layer, and the linear conductor 6-B on the sixth layer are spirally connected in sequence through the interlayer connection conductors and define the transverse coil 24B illustrated in FIGS. 9A to 9C. The linear conductor 12-C on the 12th layer, the linear conductor 5-C on the fifth layer, the linear conductor 11-C on the 11th layer, and the linear conductor 6-C on the sixth layer are spirally connected in sequence through the interlayer connection conductors and define the transverse coil 24C illustrated in FIGS. 9A to 9C. The linear conductor 4-B on the fourth layer, the linear conductor 12-D on the 12th layer, the linear conductor 5-D on the fifth layer, the linear conductor 11-D on the 11th layer, and the linear conductor 6-D on the sixth layer are spirally connected in sequence through the interlayer connection conductors and define the transverse coil 24D illustrated in FIGS. 9A to 9C.

In the third preferred embodiment, in each of the transverse coils 24A to 24D, two linear conductors including different turns and being adjacent in the stacking direction have also different line widths. Thus, even if there is misregistration or misalignment of linear conductors at the time of manufacturing, an opposed area of the linear conductors is ensured. Therefore, the inductance value of each of the transverse coils 24A to 24D is ensured.

Any one or all of the linear conductors may have a multilayer structure, for example. In that case, an effective cross-sectional area of the linear conductors is increased, and thus the wiring resistance is reduced. Accordingly, the Q values of the resonant circuits LC1, LC2, LC3, and LC4, which include the transverse coils 24A, 24B, 24C, and 24D, respectively, is increased.

As described in the above preferred embodiments, the high frequency components according to the preferred embodiments enable and define various LC resonant circuits. In every case, the inclusion of the transverse coils and internal capacitors reduces the size of the multilayer body.

In the above-described preferred embodiments, examples in which transverse coils define the inductors for resonance of LC resonant circuit are illustrated. The transverse coils may also define other inductors, such as inductors for inter-resonator coupling between the LC resonant circuits or inductors for external-terminal coupling between the LC resonant circuits and the input and output terminals. In the above-described preferred embodiments, examples in which internal capacitors define the capacitors for inter-resonator coupling between the LC resonant circuits are illustrated. The internal capacitors may also define other capacitors, such as capacitors for resonance in the LC resonant circuits or capacitors for external coupling between the LC resonant circuits and the input and output terminals. In the above-described preferred embodiments, examples in which longitudinal coils define the inductors connected in series with the LC resonant circuits are illustrated. The longitudinal coils may also define other inductors, such as inductors for resonance each defining a portion of the LC resonant circuit or inductors for inter-resonator coupling between the LC resonant circuits. In the above-described preferred embodiments, a specific number of stages is illustrated. The number of stages is not limited to the above-described number. Other numbers of stages may also be used, and the number of stages may be increased within the scope of the present invention. Although not illustrated in the preferred embodiments, the high frequency component may also be used in a band elimination filter.

In any of the above-described preferred embodiments, the external coupling between the resonant circuits and the input and output terminals may be provided by electromagnetic coupling through inductors, by capacitive coupling through capacitors, or by tap coupling using direct wiring, for example.

When LC resonant circuits in multiple stages including at least input and output stages and an intermediate stage are used, a transverse coil included in the intermediate-stage LC resonant circuit may preferably have a low resistance achieved by using linear conductors each having a larger width than that of a transverse coil included in each of LC resonant circuits in the input and output stages. In this case, in particular, the Q value of the intermediate-stage transverse coil is increased, and the insertion loss is significantly improved.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high frequency component comprising:
    a multilayer body including a plurality of insulating layers stacked in a stacking direction;
    linear conductors extending along surfaces of the plurality of insulating layers;
    interlayer connection conductors extending through at least one of the plurality of insulating layers;
    planar conductors extending along the surfaces of the plurality of insulating layers;
    a transverse coil including the linear conductors and the interlayer connection conductors spirally wound in a plurality of turns around a winding axis extending in a direction perpendicular or substantially perpendicular to the stacking direction in a plane perpendicular or substantially perpendicular to the winding axis;
    an internal capacitor including at least two of the planar conductors opposed to each other such that at least one of the plurality of insulating layers is disposed therebetween; and
    an external capacitor including at least an additional two of the planar conductors arranged to oppose each other such that at least one of the plurality of insulating layers is disposed therebetween; wherein
    the internal capacitor is arranged within a coil opening of the transverse coil when viewed along the winding axis of the transverse coil;
    the external capacitor is arranged outside the coil opening of the transverse coil when viewed along the winding axis of the transverse coil; and
    the external capacitor and the transverse coil define an LC resonant circuit.

2. The high frequency component according to claim 1, wherein the at least one of the plurality of insulating layers between the planar conductors in the internal capacitor has a relative permittivity higher than a relative permittivity of another one of the plurality of insulating layers.

3. The high frequency component according to claim 1, wherein the at least one of the plurality of insulating layers between the planar conductors in at least one of the internal capacitor and the external capacitor has a relative permittivity higher than a relative permittivity of another one of the plurality of insulating layers.

4. The high frequency component according to claim 1, further comprising:
    a plurality of the transverse coils; wherein
    coil openings in each of the plurality of transverse coils overlap each other when viewed along winding axes of the plurality of transverse coils.

5. The high frequency component according to claim 1, wherein, of the linear conductors included in the transverse coil, two linear conductors including different turns and being adjacent in the stacking direction have different line widths.

6. The high frequency component according to claim 1, wherein, of the linear conductors included in the transverse coil, two linear conductors including a same number of turns and being adjacent in the stacking direction are connected in parallel with each other through the interlayer connection conductors.

7. A filter component comprising:
    the high frequency component according to claim 1; and
    a filter circuit included in the high frequency component; wherein
    the filter circuit includes a plurality of LC resonant circuits each including the transverse coil; and
    the transverse coils included in the LC resonant circuits are configured such that their winding axes are parallel or substantially parallel with each other and their coil openings overlap each other when viewed along the winding axes.

8. The filter component according to claim 7, wherein the internal capacitor defines a capacitor configured to provide inter-resonator coupling between the plurality of LC resonant circuits.

9. The filter component according to claim 7, wherein the plurality of LC resonant circuits include an input-stage LC resonant circuit, an output-stage LC resonant circuit, and an intermediate-stage LC resonant circuit coupled between the input-stage LC resonant circuit and the output-stage LC resonant circuit; and
    each of the linear conductors included in the transverse coil included in the intermediate-stage LC resonant circuit has a width greater than a width of each of the linear conductors included in each of the input-stage LC resonant circuit and the output-stage LC resonant circuit.

10. The filter component according to claim 9, wherein the plurality of LC resonant circuits includes at least two of the intermediate-stage LC resonant circuits.

11. The filter component according to claim 10, wherein one of the input-stage LC resonant circuit and the output-stage LC resonant circuit is spaced away from an adjacent one of the at least two intermediate-stage LC resonant circuits by a greater distance than a distance by which the other of the input-stage LC resonant circuit and the output-stage LC resonant circuit is spaced away from an adjacent one of the at least two intermediate-stage LC resonant circuits.

12. The filter component according to claim 7, wherein the filter circuit is a high pass filter.

13. The filter component according to claim 7, wherein one of the transverse coils is wound in a different direction than another one of the transverse coils.

14. The filter component according to claim 7, wherein the filter circuit is a low pass filter.

15. The filter component according to claim 7, wherein the filter circuit is a band pass filter.

16. The high frequency component according to claim 1, wherein the transverse coil includes at least three of the interlayer connection conductors and at least three of the linear conductors.

17. The high frequency component according to claim 1, further comprising:
    a plurality of the internal capacitors; wherein
    one of the at least two planar conductors of each of the plurality of the internal capacitors is defined by a common ground conductor.

18. The high frequency component according to claim 1, further comprising:
    a plurality of the external capacitors; wherein
    one of the at least two additional planar conductors of each of the plurality of the external capacitors is defined by a common ground conductor.

19. A high frequency component comprising:

a multilayer body including a plurality of insulating layers stacked in a stacking direction;

linear conductors extending along surfaces of the plurality of insulating layers;

interlayer connection conductors extending through at least one of the plurality of insulating layers;

planar conductors extending along the surfaces of the plurality of insulating layers;

a transverse coil including the linear conductors and the interlayer connection conductors spirally wound in a plurality of turns around a winding axis extending in a direction perpendicular or substantially perpendicular to the stacking direction in a plane perpendicular or substantially perpendicular to the winding axis;

an internal capacitor including at least two of the planar conductors opposed to each other such that at least one of the plurality of insulating layers is disposed therebetween; and a longitudinal coil including the linear conductors wound around a winding axis extending in the stacking direction; wherein the internal capacitor is arranged within a coil opening of the transverse coil when viewed along the winding axis of the transverse coil; and the longitudinal coil is arranged within the coil opening of the transverse coil when viewed along the winding axis of the transverse coil.

20. The high frequency component according to claim 19, further comprising:

an external capacitor including at least an additional two of the planar conductors arranged to opposed to each other such that at least one of the plurality of insulating layers is disposed therebetween; wherein the external capacitor is arranged outside the coil opening of the transverse coil when viewed along the winding axis of the transverse coil; and the external capacitor and the transverse coil define an LC resonant circuit.

\* \* \* \* \*